(12) United States Patent
Shanan

(10) Patent No.: US 8,766,712 B2
(45) Date of Patent: Jul. 1, 2014

(54) QUALITY FACTOR TUNING FOR LC CIRCUITS

(75) Inventor: Hyman Shanan, Franklin Park, NJ (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/464,522

(22) Filed: May 4, 2012

(65) Prior Publication Data
US 2013/0293291 A1 Nov. 7, 2013

(51) Int. Cl.
*H03K 5/00* (2006.01)
*H03F 3/04* (2006.01)

(52) U.S. Cl.
USPC .......................................... 327/552; 330/305

(58) Field of Classification Search
USPC .................. 327/551–559; 330/305, 253, 254
See application file for complete search history.

(56) References Cited

U.S. PATENT DOCUMENTS

| | | | |
|---|---|---|---|
| 5,396,251 A | 3/1995 | Schuermann | |
| 5,491,484 A | 2/1996 | Schuermann | |
| 6,838,952 B2 * | 1/2005 | Ramet | 331/183 |
| 7,203,472 B2 * | 4/2007 | Seppinen et al. | 455/226.1 |
| 7,495,515 B1 * | 2/2009 | Branch et al. | 330/305 |
| 7,554,416 B2 * | 6/2009 | Lee et al. | 331/115 |
| 8,098,101 B2 * | 1/2012 | Savla et al. | 330/305 |
| 2003/0119469 A1 | 6/2003 | Karr et al. | |
| 2003/0176174 A1 | 9/2003 | Seppinen et al. | |
| 2005/0147193 A1 | 7/2005 | Umewaka et al. | |
| 2006/0160510 A1 | 7/2006 | Seppinen et al. | |
| 2008/0018407 A1 | 1/2008 | McCorquodale et al. | |
| 2008/0157877 A1 | 7/2008 | Feng et al. | |
| 2008/0174378 A1 | 7/2008 | Cusmai et al. | |
| 2009/0108947 A1 * | 4/2009 | Liu | 331/117 FE |
| 2009/0189697 A1 | 7/2009 | Zafonte et al. | |
| 2011/0025410 A1 | 2/2011 | Hill | |
| 2011/0034139 A1 | 2/2011 | Xuan et al. | |
| 2011/0187462 A1 | 8/2011 | Sonntag | |
| 2011/0256841 A1 | 10/2011 | Kakuya et al. | |

FOREIGN PATENT DOCUMENTS

WO   WO 2007/148282 A2   12/2007

OTHER PUBLICATIONS

Reddy, et al., "Tuned LC Clock Buffers with Static Phase Adjust," 2007 IEEE Radio Frequency Integrated Circuits Symposium, pp. 519-522.
PCT Search Report and Written Opinion of Sep. 25, 2013, for International Application No. PCT/US2013/039064 filed May 1, 2013. 16 pages.

* cited by examiner

*Primary Examiner* — Dinh T. Le
(74) *Attorney, Agent, or Firm* — Knobbe, Martens, Olson & Bear, LLP

(57) ABSTRACT

Apparatus and methods are also disclosed related to tuning a quality factor of an LC circuit. In some implementations, the LC circuit can be embodied in a low-noise amplifier (LNA). A quality factor adjustment circuit can increase and/or decrease conductance across the LC circuit. This can stabilize a parasitic resistance in parallel with the LC circuit. In this way, a gain of the LC circuit can be stabilized.

29 Claims, 16 Drawing Sheets

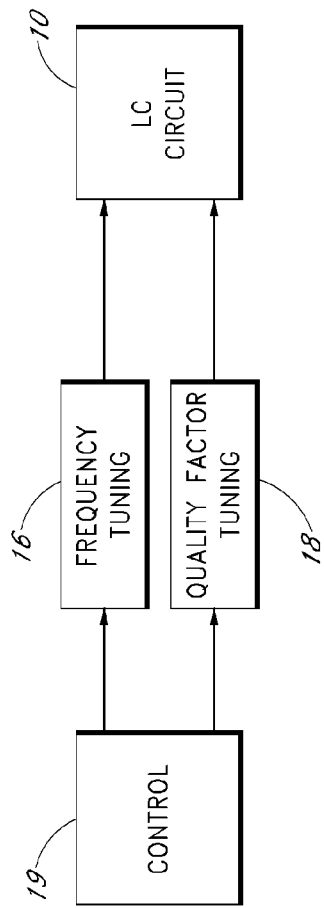
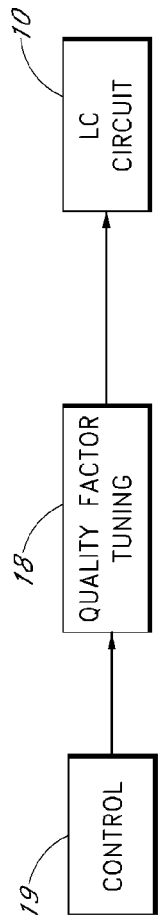
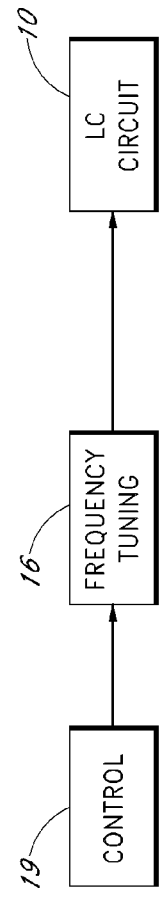

QUALITY FACTOR TUNING FOR LC CIRCUITS

TECHNICAL FIELD

This disclosure relates to electronics, and, more particularly, to circuits configured to oscillate.

DESCRIPTION OF THE RELATED TECHNOLOGY

Electronic systems can include wireless communications transceivers. Wireless communication transceivers can be used in a variety of applications, such as smart electric grid wireless networks, wireless sensor networks, point-to-point data links, data streaming applications, mobile communications networks, the like, or any combination thereof. Specifications for such transceivers can have requirements for low and/or ultra-low power consumption. For instance, a wireless transceiver used in a wireless sensor network can be required to consume no more than about 22 mW of power in receive mode, according to some specifications. This can enable the wireless transceiver to operate for 20 years from AA batteries without replacing the batteries. Alternatively or additionally, highly accurate location information of the devices used in these applications can be required in particular wireless sensor networks and/or smart electric grid devices. These networks can include a large number (for example, millions) of devices within a relatively local area, such as a metropolitan area. It can be desirable to provide accurate location information for each device.

In some applications, a receiver can include various radio frequency (RF) blocks, such as a low noise amplifier (LNA), an RF mixer, a baseband amplifier, a channel filter, a programmable gain amplifier (PGA), an analog-to-digital converter (ADC), the like, or any combination thereof. A receiver can be a standalone part or a receive portion of a transceiver. Each of the RF blocks of the receiver can have a nominal gain, from which a total nominal gain from the receiver to a particular point can be determined. The total nominal gain can affect receiver parameters, such as sensitivity and/or linearity. Variation in the receiver gain from the nominal gain in the presence of temperature variation, supply variation, process variations, or any combination thereof can result in variation in receiver parameters, such as sensitivity and/or linearity. In some cases, such variation can degrade receiver performance metrics, which can cause the receiver to receive a signal or not receive the signal.

The total receiver gain can determine how accurately the received signal strength can be measured. One metric for measuring the received signal strength is a received signal strength indication (RSSI) of the receiver. In some wireless systems, it can be desirable to accurately estimate the signal strength at the receiver input using the receiver RSSI function with a threshold accuracy, for example an accuracy of about +/−1 dB. The wireless systems can be used in location measurements in which an accurate location of devices is desired and the accuracy of the location within a few meters or less can depend on the accuracy of the receiver RSSI. The absolute accuracy of the RSSI measurement, as well as RSSI measurement variation across process, supply voltage and temperature (together "PVT") can be important for these applications.

In an RF receiver, the gain of the RF blocks can be more challenging to stabilize across PVT variations than the gain of base-band blocks. For instance, it can be challenging to stabilize the gain of an RF block, such as an LNA, that has a voltage gain that is set using one or more LC circuits. As one example, frequency of a peak of the real impedance and a value of the peak real impedance can vary with PVT variations. Accordingly, a need exists for stabilizing the gain of RF circuits that include LC circuits.

SUMMARY OF CERTAIN INVENTIVE ASPECTS

In one embodiment, an apparatus includes an LC circuit, a positive transconductance circuit, and a negative transcoductance circuit. The LC circuit has a first end and a second end, and the LC circuit has a resonant frequency. The positive transconductance circuit is configured to increase the conductance between the first end of the LC circuit and the second end of the LC circuit. The negative transconductance circuit is configured to decrease the conductance between the first end of the LC circuit and the second end of the LC circuit.

According to some implementations, an inductor of the LC circuit can include metal windings, and the positive transconductance circuit and the negative transconductance circuit can be configured to adjust the conductance between the first end of the LC circuit and the second end of the LC circuit to compensate for variation in resistance of the metal windings.

In certain implementations, the apparatus can include a low-noise amplifier (LNA) that includes the LC circuit. In accordance with some of these implementations, the positive transconductance circuit and the negative transconductance circuit can be configured to vary the gain of the LNA by tuning of the quality factor of the LC circuit. For instance, at least one of the positive transconductance circuit or the negative transconductance circuit can be configured to set a voltage gain range for the LNA based at least in part on a programmable bias voltage applied to a gate of a transistor of the at least one of the positive transconductance circuit or the negative transconductance circuit. According to various implementations, the positive transconductance circuit can be configured to increase the conductance between the first end of the LC circuit and the second end of the LC circuit based on a variation in a performance aspect detected by an open loop of a receiver of the apparatus. In accordance with some other implementations, the positive transconductance circuit can be configured to increase the conductance between the first end of the LC circuit and the second end of the LC circuit based on a variation in a performance aspect detected by a closed feedback loop of a receiver of the apparatus, in which the closed loop includes the LNA. The apparatus can also include an on chip radio frequency (RF) source having an output electrically coupleable to an input of the LNA according to certain implementations. Alternatively or additionally, the apparatus can include a switch configured to selectively electrically couple an input of the LNA to an off-chip RF source according to various implementations. An input of the LNA can be controllable during a quality factor tuning phase of operation to obtain target values for an algorithm to determine an amount by which to adjust the conductance between the first end of the LC circuit and the second end of the LC circuit, according to a number of implementations.

According to various implementations, the apparatus can also include a temperature detection element configured to obtain an indicator of a temperature associated with the LC circuit, in which the positive transconductance circuit and the negative trans-conductance circuit are configured to adjust the conductance between the first end of the LC circuit and the second end of the LC circuit based at least in part on the indicator of IC temperature.

In accordance with certain implementations, the apparatus can also include an oscillator separate from the LC circuit, in which the positive transconductance circuit and the negative transconductance circuit are configured to adjust the conductance between the first end of the LC circuit and the second end of the LC circuit based at least in part on an indicator of quality factor generated by the oscillator separate from the LC circuit.

In some implementations, the LC circuit can be embodied in a receiver, in which the receiver includes a receiver component configured to measure received signal strength indication (RSSI), and in which the positive transconductance circuit and the negative transconductance circuit are configured to adjust the conductance between the first end of the LC circuit and the second end of the LC circuit based at least in part on the RSSI.

According to a number of implementations, the positive transconductance circuit and the negative transconductance circuit can be configured to stabilize parasitic resistance across the first end of the LC circuit and the second end of the LC circuit.

In various implementations, the negative transconductance circuit can include a first field effect transistor and a second field effect transistor, the first field effect transistor having a gate coupled to the first end of the LC circuit and a drain coupled to the second end of the LC circuit, and the second field effect transistor having a gate coupled to the second end of the LC circuit and a drain coupled to the first end of the LC circuit. According to some of these implementations, the positive transconductance circuit can include a third field effect transistor and a fourth field effect transistor, in which the third field effect transistor is diode connected and has a drain coupled to the second end of the LC circuit, and in which the fourth field effect transistor is diode connected and has a drain coupled to the first end of the LC circuit.

In another embodiment, an apparatus includes an LNA. The LNA includes an LC circuit and a quality factor tuning circuit. The LC circuit has a first node and a second node. The quality factor tuning circuit is electrically coupled to the first node of the LC circuit and the second node of the LC circuit. The quality factor tuning circuit is configured to stabilize the gain of the LNA by adjusting the conductance between the first node of the LC circuit and the second node of the LC circuit.

In another embodiment, a method of tuning a quality factor of an LC circuit includes: detecting an indication of a variation in the quality factor of the LC circuit; adjusting a parasitic resistance across the LC circuit based at least in part on the indication of the variation; and stabilizing the parasitic resistance of the LC circuit as operating conditions of the LC circuit change.

In some implementations, adjusting the parasitic resistance across the LC circuit can include increasing the conductance between a first end of the LC circuit and the second end of the LC circuit via a positive transconductance circuit, and decreasing the conductance between a first end of the LC circuit and the second end of the LC circuit via a negative transconductance circuit.

According to certain implementations, stabilizing the parasitic resistance across the LC circuit can include stabilizing the quality factor of the LC circuit.

In accordance with various implementations, the LC circuit is embodied in an LNA.

In a number of implementations, the variation can be caused by at least one of a temperature variation or a process variation.

In certain implementations, the operating conditions can include a temperature of an integrated circuit that includes the LC circuit.

According to some implementations, the method can also include generating the indicator of the variation with a temperature detection element.

In accordance with various implementations, the method can also include generating the indicator of the variation with an oscillator separate from the LC circuit. According to some of these implementations, the method can also include detecting an onset of oscillation of the oscillator that is separate from the LC circuit, wherein adjusting is based at least in part on said detecting.

In certain implementations, the LC circuit can be embodied in a receiver, and the method can also include measuring a received signal strength indication (RSSI) of an RF signal received by the receiver, and in which the indicator of the variation is the measured RSSI.

According to some implementations, the LC circuit can be embodied in an LNA of a receiver, and the method can also include forcing the LNA into oscillation, and in which stabilizing the parasitic resistance of the LC circuit is based on RSSI.

In accordance with some implementations, the method can also include receiving a signal from an off-chip RF source at an input of an LNA that includes the LC circuit, and determining RSSI based on a specified power level of the signal from the off-chip RF source, and in which stabilizing the parasitic resistance of the LC circuit is based on the RSSI.

In another embodiment, an apparatus includes a receiver. The receiver includes a receiver component, a control block, an LC circuit, and a switching network. The receiver component is configured to generate a received signal strength indication (RSSI) of a radio frequency (RF) signal received by the receiver. The control block is configured to generate LC circuit frequency tuning data based at least in part on the RSSI. The LC circuit has a resonant frequency. The switching network is configured to adjust the resonant frequency of the LC circuit based at least in part on the LC circuit frequency tuning data.

According to various implementations, the LC circuit can be embodied in a low noise amplifier (LNA). In some of these implementations, the switching network can be configured to control the LC circuit so as to compensate for a variation in the resonant frequency of the LC circuit of the LNA.

In accordance with a number of implementations, the receiver component is configured to determine RSSI.

The receiver can include a closed feedback loop in which the RSSI is provided to the control block in accordance with certain implementations. In some of these implementations, the control block can be configured to generate the LC circuit frequency tuning data based at least in part on a two-dimensional Successive Approximation (SAR) algorithm. Alternatively or additionally, the control block can be configured to generate the LC circuit frequency tuning data based at least in part on a linear search algorithm according to various implementations.

According to certain implementations, the apparatus can also include a positive transconductance circuit configured to increase the conductance between a first end of the LC circuit and a second end of the LC circuit, and a negative transconductance circuit configured to decrease the conductance between the first end of the LC circuit and the second end of the LC circuit.

In a number of implementations, the receiver is embodied in a transceiver.

In another embodiment, an apparatus includes a receiver. The receiver includes an oscillator, a control circuit, and a low noise amplifier (LNA). The oscillator is configured to generate frequency tuning data. The control circuit is configured to generate LC circuit frequency tuning data based at least in part on the frequency tuning data generated by the oscillator. The LNA includes an LC circuit separate from the oscillator, in which the LC circuit has a resonant frequency. The LNA also includes a switching network configured to adjust the resonant frequency of the LC circuit based at least in part on the frequency data generated by the oscillator that is separate from the LC circuit.

In various implementations, the oscillator can include a scaled replica of the LC circuit.

According to certain implementations, the control circuit can be configured to map frequency tuning data from the oscillator to LNA frequency tuning data. In some of these implementations, the control circuit can include a look up table storing data for mapping frequency tuning data from the oscillator to LNA frequency tuning data.

In accordance with a number of implementations, the frequency tuning data generated by the oscillator can be indicative of an onset of oscillation of the oscillator.

The oscillator can be a voltage-controlled oscillator (VCO) according to certain implementations.

In various implementations, the apparatus can also include a quality factor tuning circuit configured to stabilize a parasitic resistance across the LC circuit by adjusting conductance across the LC circuit.

In yet another embodiment, a method of tuning a resonant frequency of an LC circuit of a receiver includes: obtaining a received signal strength indication (RSSI) of a radio frequency (RF) signal received by the receiver; generating LC circuit frequency tuning data based at least in part on the indicator of RSSI; and tuning the resonant frequency of the LC circuit based at least in part on the LC circuit frequency tuning data.

According to a number of implementations, the LC circuit can be embodied in a low noise amplifier (LNA). In some implementations, the method can also include forcing the LNA into oscillation, in which generating LC frequency tuning data is based at least in part on data generated by a digital demodulator of the receiver while the LNA is forced into oscillation. In certain implementations, the method can also include receiving a signal from an off-chip RF source at an input of an LNA that includes the LC circuit, and determining RSSI based on a specified power level of the signal from the off-chip RF source.

In certain implementations, generating LC circuit frequency tuning data can include applying a two-dimensional Successive Approximation (SAR) algorithm on the RSSI.

In accordance with various implementations, generating LC circuit frequency tuning data can include applying a linear search algorithm on the RSSI.

The method can also include determining RSSI in certain implementations.

In some implementations, tuning can include compensating for variation in a resonant frequency of the LC circuit.

According to a number of implementations, tuning can compensate for at least one of variation in capacitance of oxide layers between an inductor of the LC circuit and a substrate or variation in capacitance of active devices of a low-noise amplifier that includes the LC circuit.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIGS. 1A-1C are block diagrams of LC circuits and frequency and/or quality factor tuning circuits.

FIGS. 7-13 are schematic block diagrams of RF receivers and components thereof, and graphs relating thereto, according to some embodiments.

FIG. 7 is a block diagram of an example RF receiver configured to tune a quality factor and/or a frequency of an LNA.

FIG. 9 is a block diagram of another example RF receiver that is configured to use a VCO for tuning a resonant frequency of the LC circuit of the LNA and/or to detect variation in quality factor of the LC circuit of the LNA.

FIG. 10 is a block diagram of an example of a VCO separate from the LNA that can detect variations in quality factor.

FIG. 11 is a block diagram of an example RF receiver configured to receive an external off-chip RF source at an input of the LNA for frequency tuning and/or quality factor tuning.

FIG. 12 is a block diagram of an example RF receiver that includes an on-chip RF source coupled to an input of the LNA for frequency and/or quality factor tuning.

FIG. 13 is a block diagram of an example RF receiver in which an input to the LNA can be controlled during a frequency and/or quality factor tuning phase of operation to obtain target values for an algorithm to determine the quality factor tuning value and/or the frequency tuning value.

DETAILED DESCRIPTION OF CERTAIN EMBODIMENTS

Figure 2:
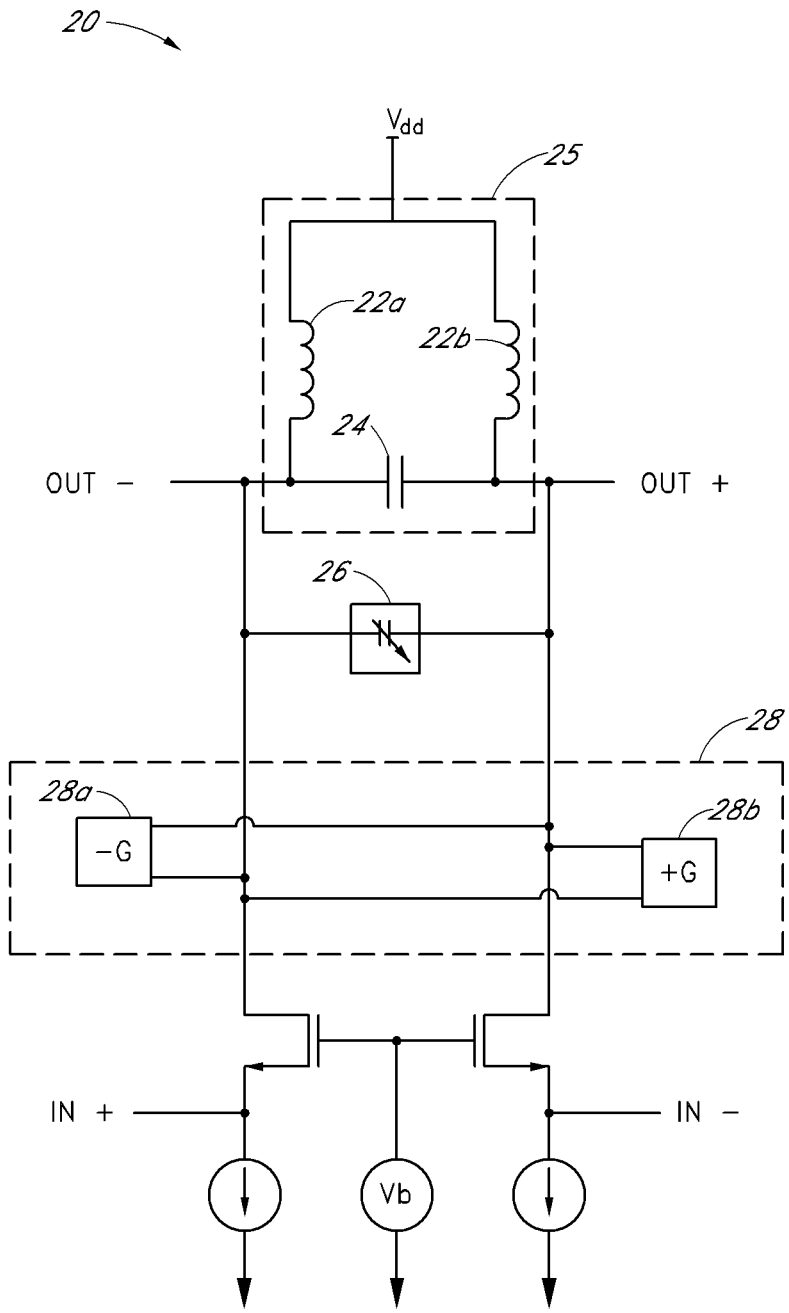
FIG. 2 is a schematic diagram of an example LNA that can be used in an RF receiver according to some embodiments.

The following detailed description of certain embodiments presents various descriptions of specific embodiments of the inventions. However, the inventions can be embodied in a multitude of different ways as defined and covered by the claims. In this description, reference is made to the drawings in which like reference numerals indicate identical or functionally similar elements. Headings, if any, are provided for convenience only and do not necessarily affect the scope of the claimed invention.

Generally described, aspects of this disclosure relate to adjusting a gain of an LC circuit that includes one or more inductors (L) and one or more capacitors (C). An LC circuit may also be referred to as a resonant circuit or a tuned circuit. In some instances, the LC circuit can be referred to as an LC tank. The inductor(s) and/or capacitor(s) of the LC circuit can be coupled in series and/or parallel with each other.

More specifically, aspects of this disclosure relate to tuning a resonant frequency and/or a quality factor of an LC circuit. In some implementations, the LC circuit can correspond to an LC tank resonant circuit of a low noise amplifier (LNA). Although the LC circuit may be described as an LC circuit of an LNA for illustrative purposes, it will be understood that any combination of features described herein with reference to an LC circuit of an LNA can be implemented in connection with any other suitable LC circuit. By stabilizing a gain of an LNA, location information indicative of a position of a device that includes the LNA can be accurately obtained according to certain implementations.

A gain $G_{LNA}$ of the LNA can be represented by a transconductance $g_{M,LNA}$ of the LNA multiplied by a parasitic resistance $R_{P,LNA}$ across the LNA LC circuit, for example, as shown in Equation 1.

$$G_{LNA}=g_{M,LNA} \times R_{P,LNA} \quad \text{(Eq. 1)}$$

A substantially constant $g_M$ biasing circuit can stabilize the transconductance $g_{M,LNA}$. For instance, the transconductance $g_{M,LNA}$ can be the transconductance of one or more transistors in a sustaining amplifier of the LNA that are configured to drive an output node. It can be desirable for the transconductance $g_{M,LNA}$ of the LNA to be substantially constant because an input impedance of the LNA can be determined by the input transconductance of the LNA. As a result, the LNA gain variation can be subject to the variation of the parasitic resistance $R_{P,LNA}$. The value of the parasitic resistance $R_{P,LNA}$ can be determined, for example, by an impedance of an LNA load included in the LNA. The LNA load can include an inductor load coupled with a capacitive load on the inductor due to active LNA elements. This can form an LC circuit as the LNA load. The LC circuit can be designed such that a zero imaginary component of impedance across the LC circuit occurs at the center of the frequency band of operation of the LNA. As such, inductive plus capacitive loads can resonate at the center of the frequency band of operation of the LNA. As a result, the parasitic resistance $R_{P,LNA}$ can be the load of the LNA at the resonant frequency. The parasitic resistance $R_{P,LNA}$ can be equivalent to the parallel resistance across the LC circuit of the LNA. The value of the parasitic resistance $R_{P,LNA}$ can vary due to at least one of two main factors: the quality factor of the LC circuit and the frequency of the zero imaginary component of the LC circuit. Thus, to stabilize the LNA gain, the parasitic resistance $R_{P,LNA}$ can be stabilized in the presence of the variations due to the quality factor of the LC circuit and/or the frequency of the zero imaginary component of impedance across the LC circuit.

The parasitic resistance $R_{P,LNA}$ of the LNA can be based on the quality factor of the LC circuit. The quality factor of the LNA device capacitances and/or other parasitic capacitive components may not typically determine the overall quality factor of the LC circuit. In contrast, an inductor of the LC circuit may have a significant impact on the overall quality factor. Since the inductor can typically be formed of metal windings, the quality factor can be determined by a resistance of the metal being used in such implementations. The metal resistance may vary, for example, in the presence of temperature variations and/or process variations.

To stabilize the value of the parasitic resistance $R_{P,LNA}$, a positive or a negative transconductance can be added in parallel with the parasitic resistance $R_{P,LNA}$. The sign of the additional transconductance can be based on the direction of change of the value of the parasitic conductance $G_{MP,LNA}$, which can be the reciprocal of the parasitic resistance $R_{P,LNA}$. The resistance of the metal from which the inductor is formed can have a positive temperature coefficient. As a result, if the temperature increases, the series resistance of the inductor can consequently increase. This can cause the value of parasitic resistance $R_{P,LNA}$ to decrease (its conductance can increase and resistance has an inverse relationship to conductance). Thus, adding a negative conductance to parasitic conductance $G_{MP,LNA}$ can reduce effective parasitic resistance $R_{P,LNA}$ of the LNA to a nominal value. The nominal value can represent the parasitic resistance $R_{P,LNA}$ if there were no variations, such as process variations, supply voltage variations, temperature variations, or any combination thereof. On the other hand, if the temperature decreases, the value of the parasitic conductance $G_{MP,LNA}$ can increase. Accordingly, adding a positive conductance can reduce the parasitic conductance $G_{MP,LNA}$ to be closer to the nominal value. The addition of a positive or a negative conductance in parallel with the parasitic conductance $G_{MP,LNA}$ can, in effect, stabilize or tune the quality factor of the LC circuit such that the quality factor remains close to a nominal value that represents a quality factor of the LC circuit in the presence of no variations, such as process variations, supply voltage variations, temperature variations, or any combination thereof.

A zero imaginary component of impedance across the LC circuit can be approximately equal to zero at the resonant frequency of the LC circuit. The frequency of the zero imaginary component of the impedance across the LC circuit may vary due to, for example, a variation of the capacitive component of the active devices of the LNA and/or the permittivity of oxide layers between the inductor and a substrate. As a result, a magnitude of the impedance at the center of the frequency band of the LC circuit may vary. Additionally, the LNA may operate over a frequency band around the resonant frequency. For instance, for the 2.4 GHz ISM band, the frequency band may extend from approximately 2.4 GHz to approximately 2.4835 GHz. Thus, it can be desirable for the frequency of the zero imaginary component of the LC circuit to be tuned to a desired frequency based on a channel frequency selected for the receiver.

The frequency of the zero imaginary component of the of the impedance across the LC circuit of the LNA can be tuned to a desired frequency a number of ways based on the channel frequency selected for the receiver. As one example, a scaled replica of an LC circuit-based VCO (or other oscillator) capacitive tuning network that is separate from the LNA can be used to adjust the operating frequency of the LNA LC circuit. Since the frequency of operation of the LNA can be a factor of the operating frequency of the VCO (for example, a factor of 2), a scaling factor can be applied to the capacitive tuning network configured to adjust the operating frequency of the LNA LC circuit. The VCO capacitive tuning network can include switched capacitors configured to adjust a frequency band of the VCO LC circuit. The VCO, which can be part of a phase-locked loop (PLL), can be tuned to a desired frequency using high frequency counters based on conventional PLL techniques. A VCO resonant frequency calibration algorithm can select a desired frequency band. Thus, when the LNA LC circuit is a scaled replica of the separate VCO LC circuit, a scaling factor can be used to convert the VCO frequency band obtained by the tuning algorithm to obtain the desired LNA frequency band. It will be understood that the LNA LC circuit frequency can be adjusted a number of other ways based on frequency tuning information, for example, as described below.

FIGS. 1A-1C are block diagrams of LC circuits and frequency and/or quality factor tuning circuits. An LC circuit 10 can oscillate at a resonant frequency. A frequency tuning circuit 16 can adjust the resonant frequency of the LC circuit 10. A quality factor tuning circuit 18 can adjust the quality factor associated with the LC circuit 10. As shown in FIG. 1A, the LC circuit 10 can be tuned by the frequency tuning circuit 16 and the quality factor tuning circuit 18. In other implementations, the LC circuit 10 can be tuned by one of the quality factor tuning circuit 18 (FIG. 1B) or the frequency tuning circuit 16 (FIG. 1C). The quality factor tuning circuit 18 can tune a quality factor of the LC circuit 10, for example, as described herein. The frequency tuning circuit 16 can tune a frequency of the LC circuit 10, for example, as described herein. The quality factor tuning and/or the frequency tuning described herein can be implemented in hardware, in firmware/software, or by a combination of both firmware/software and hardware. Such firmware/software can include instructions stored in a non-transitory computer readable media executable by one or more processors.

A control block 19 can control the frequency tuning circuit 16 and/or the quality factor tuning circuit 18. In addition, the control block 19 can implement one or more tuning algorithms, such as a linear search algorithm or a successive approximation (SAR) algorithm, to generate a frequency circuit control value and/or a quality factor circuit control value. For instance, the control block 19 can generate the frequency tuning control value based on an indicator of RSSI or other suitable data. The indicator of RSSI can be generated by a receiver component. For example, the receiver component can measure and/or estimate RSSI. As another example, the control block 19 can generate the frequency tuning control value based on frequency tuning data for an oscillator, such as a VCO, separate from the LC circuit 10. Alternatively or additionally, the control block 19 can generate the quality factor control value based on an indicator of a temperature of an integrated circuit on which the LC circuit 10 is embodied, quality factor data generated by an oscillator, such as a VCO, separate from the LC circuit 10, any other data suitable data for adjusting the quality factor of the LC circuit 10, or any combination thereof.

FIG. 2 is a schematic diagram of an example LNA 20 that can be used in an RF receiver. The receiver can be a stand alone part or a receiver portion of a transceiver. The example LNA 20 illustrated in FIG. 2 is common gate LNA architecture. The LNA 20 can include an LC circuit, such as an LC circuit 25. The LC circuit 25 can be referred to as an LC tank. The LNA 20 can also include a frequency tuning circuit 26 and/or a quality factor tuning circuit 28.

The LC circuit 25 can generate signals at a first node OUT+ and a second node OUT−. The first node can be referred to as a first end of the LC circuit 25, and the second node can be referred to as the second end of the LC circuit 25. For example, the voltage at the first node OUT+ and the second node OUT− can be periodic as the LC circuit 25 resonates. The signals at the first node OUT+ and the second node OUT− can be sinusoidal signals that are approximately 180 degrees out of phase with respect to each other, in some implementations. For instance, the first node OUT+ and the second node OUT− can have voltages that have opposite signs and approximately the same magnitude at any given time. In other implementations, the first node OUT+ and the second node OUT− can have voltages that have opposite logical values at any given time. In some implementations, the first node OUT+ and the second node OUT− can be referred to as a non-inverted node and an inverted node, respectively, and the signals can have values that are inverted from each other.

The LC circuit 25 can include of one or more inductors 22a, 22b coupled in parallel with and one or more capacitors 24. The one or more capacitors 24 can represent parasitic capacitances and/or device capacitances. A resonant frequency ω of the LC circuit 25 can be proportional to the reciprocal of the square root of the inductance L of the one or more inductors 22a, 22b times an effective capacitance C of the LC circuit, for example, as represented by the Equation 2.

$$\omega = \frac{1}{\sqrt{LC}} \tag{Eq. 2}$$

The resonant frequency ω of the LC circuit 25 can be tuned by the frequency tuning circuit 26 configured to adjust the effective capacitance C of the LC circuit 25. The effective capacitance can include the total capacitance of capacitive elements of the LC circuit and other parasitic capacitance(s) coupled in parallel with the LC circuit. The frequency tuning circuit 26 can include one or more capacitive circuit elements that can be coupled in parallel and/or series with a resonant portion of the LC circuit 25. For instance, the frequency tuning circuit 26 can couple a first end of a capacitive circuit element to the first node OUT+ and a second end of the capacitive circuit element to the second node OUT−. With additional effective capacitance, the resonant frequency ω of the LC circuit 25 can decrease. Conversely, with reduced effective capacitance, the resonant frequency ω of the LC circuit 25 can increase. The frequency tuning circuit 26 can tune the resonant frequency ω within a selected frequency band.

The quality factor of the LC circuit 25 can be tuned by the quality factor tuning circuit 28. The quality factor tuning circuit 28 can be configured to provide a programmable voltage gain for the LNA 20, for example, by adjusting the transconductance $g_{M,LNA}$ of the LNA 20. The quality factor tuning circuit can vary the voltage gain of the LNA 20 by a large range (for example, about 18 dB in some implementations) across operating temperatures. Alternatively or additionally, LNA noise variation can be relatively small across (for example, about 0.5 dB in some implementations) across all settings of the quality factor tuning circuit 28 and operating temperatures. As a result, the LNA 20 can meet a target noise figure even in the presence of process variations, supply voltage variations, temperature variations, the like, or any combination thereof.

The quality factor tuning circuit 28 can include a negative transconductance circuit 28a and a positive transconductance circuit 28b. The negative transconductance circuit 28a can have a first end coupled to the first node OUT+ and a second end coupled to the second node OUT−. Similarly, the positive transconductance circuit 28b can have a first end coupled to the second node OUT− and a second end coupled to the first node OUT+. Adding or subtracting transconductance in parallel with the parasitic transconductance $g_{MP,LNA}$ of the LNA 20 can tune the quality factor of the LC circuit 25 by adjusting for process variation, supply voltage variation, temperature variation, the like, or any combination thereof.

Figure 3A:
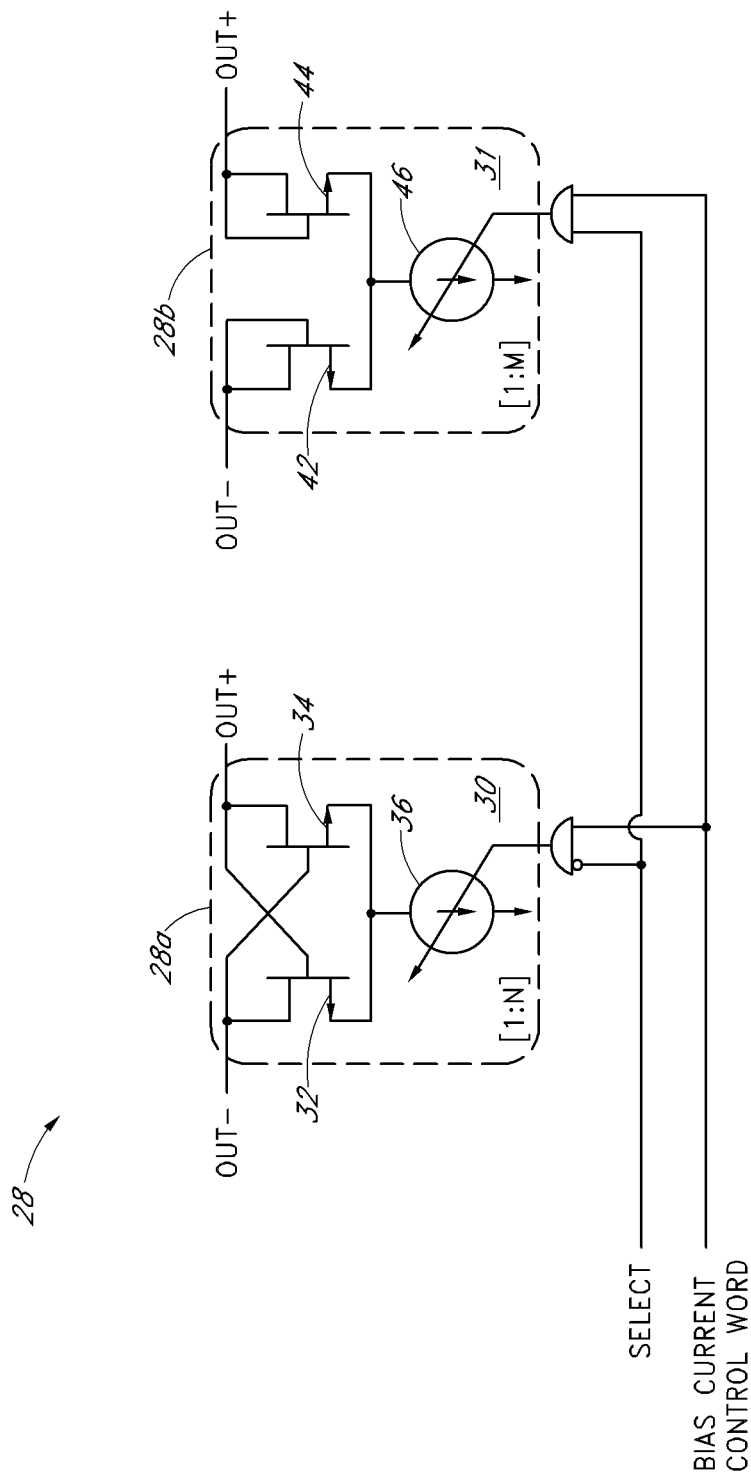
FIGS. 3A and 3B are schematic diagrams of example quality factor tuning circuits according to some embodiments.
Figure 3B:
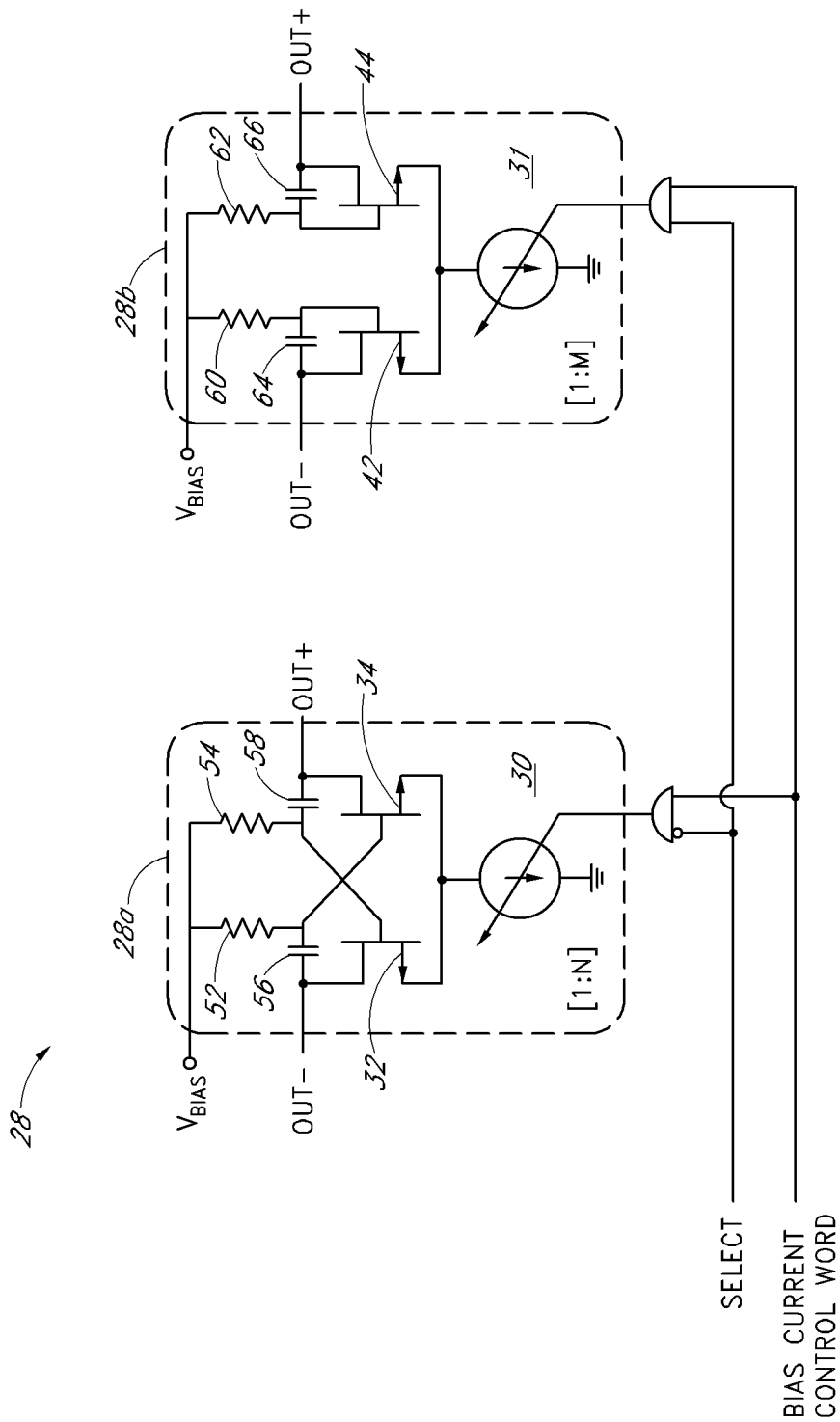

Positive transconductance and negative transconductance circuits can be implemented in a variety of ways. FIGS. 3A and 3B depict two example quality factor tuning circuits 28 that include a negative transconductance circuit 28a and a positive transconductance circuit 28b. The example quality factor tuning circuit 28 of FIG. 3A can add less additional capacitance across the LC circuit 25 than a number of other transconductance adjustment circuits, including the transconductance adjustment circuit of FIG. 3B. The example quality factor tuning circuit 28 of FIG. 3B can have a more linear operating range than a number of other transconductance adjustment circuits including the transconductance adjustment circuit of FIG. 3A. Any of the transistors of the quality factor tuning circuit 28 can be n-type devices (for example, NMOS devices as illustrated in FIGS. 3A and 3B) or p-type devices (not shown).

FIG. 3A shows an example schematic diagram of the quality factor tuning circuit 28. The negative transconductance circuit 28a and the positive transconductance circuit 28b can together tune the quality factor of an LC circuit 10, such as the LC circuit 25. For instance, the negative transconductance circuit 28a and the positive transconductance circuit 28b can adjust the conductance across the LC circuit 25 to stabilize the parasitic resistance $R_{P,LNA}$ and thereby maintain an approximately constant LNA gain.

The negative transconductance circuit 28a can include N negative transconductance unit(s) 30, where N is a positive integer. Each negative transconductance unit 30 can include two cross-coupled switches, such as first and second field effect transistors (FETs) 32 and 34, respectively. The first FET 32 and the second FET 34 can have approximately the same lengths and widths. The first FET 32 and the second FET 34 can be sized to compensate for variations in the transconductance of an LC circuit 10 due to process, supply voltage, temperature, the like, or any combination thereof at the resonant frequency of the LC circuit 10. For instance, the first FET 32 and the second FET 34 can be sized to compensate for such variations in the transconductance $g_{MP,LNA}$ of an LNA 20 at the resonant frequency of the LC circuit 10. The conductance G of each negative transconductance unit 30 can be proportional to the negative of the transconductance $g_M$ of the first FET 32 (or the second FET 34) divided by two. For example, the conductance G of each negative transconductance unit 30 can be represented by Equation 3.

$$G = -g_M/2 \qquad \text{(Eq. 3)}$$

As illustrated in FIG. 3A, the first FET 32 can have a gate coupled to a drain of the second FET 34. The second FET 34 can have a gate coupled to a drain of the first FET 32. The drain of the first FET 32 can be coupled to the second node OUT– of the LC circuit 25 of FIG. 2. The drain of the second FET 34 can be coupled to the first node OUT+ of the LC circuit 25 of FIG. 2. Sources of the first FET 32 and the second FET 34 can be coupled to a current source 36.

The positive transconductance circuit 28b can include M positive transconductance unit(s) 31, where M is a positive integer. Each positive transconductance unit 31 can include two diode connected switches, such as third and fourth field effect transistors (FETs) 42 and 44, respectively. The third FET 42 and the fourth FET 44 can have approximately the same length and width. The third FET 42 and the fourth FET 44 can be sized to compensate for variations in the transconductance of an LC circuit 10 due to process, supply voltage, temperature, the like, or any combination thereof. For instance, the third FET 42 and the fourth FET 44 can be sized to compensate for such variations in the transconductance $g_{M,LNA}$. The conductance G of each positive transconductance unit 31 can be proportional to the transconductance $g_M$ of the third FET 42 (and/or the fourth FET 44) divided by two. For example, the conductance G of each positive transconductance unit 31 can be represented by Equation 4.

$$G = g_M/2 \qquad \text{(Eq. 4)}$$

As illustrated in FIG. 3A, the third FET 42 can have a gate coupled to a drain of the third FET 42 to form a diode connection. Similarly, the fourth FET 44 can have a gate coupled to a drain of the fourth FET 44 to form a diode connection. The drain of the third FET 42 can be coupled to the second node OUT– of the LC circuit 25 of FIG. 2. The drain of the fourth FET 44 can be coupled to the first node OUT+ of the LC circuit 25 of FIG. 2. Sources of the third FET 42 and the fourth FET 44 can be coupled to a current source 46.

The N negative transconductance units 30 can each have transistors that are approximately the same size in some implementations. In other implementations, one or more of the N negative transconductance units 30 can have transistors that are sized differently from one another such that they can adjust the transconductance by different amounts. The M positive transconductance units 31 can each have transistors that are approximately the same size in some implementations. In other implementations, one or more of the M positive transconductance units 31 can have transistors that are sized differently from one another such that they can adjust the transconductance by different amounts. M may equal N in some implementations. However, M need not equal N. For instance, in certain applications there may be different needs for increasing or decreasing transconductance such that a different number of negative transconductance units 30 than positive transconductance units 31 may be desired. N can be any suitable number, such as 1, 2, 4, 5, 8, 16, 32, or more. Likewise, M can be any suitable number, such as 1, 2, 4, 5, 8, 16, 32, or more.

At least one bias current control signal can be provided to the quality factor tuning circuit 28. For example, a bias current digital-to-analog converter (DAC) can generate a control signal to control a current level of the bias current provided to the quality factor tuning circuit 28. Changing the current level can adjust an amount by which transconductance is adjusted. The bias current DAC can be controlled by a bias current control word and a select signal. The bias control word and/or the select signal can be digital signals. The select signal can control whether the negative transconductance circuit 28a or the positive transconductance circuit 28b is activated. For example, circuitry can implement a logical AND of the select signal (or the complement of the select signal) and one or more bits of the bias control word to determine whether the quality factor tuning circuit 28 increases or decreases conductance across an LC circuit 10, such as the LC circuit 25. Each bit of the bias current control word can control a current sources 36 in negative transconductance unit 30 or a current source 46 in a positive transconductance unit 31 based on whether the select signal activates the negative transconductance circuit 28a or the positive transconductance circuit 28b. In other implementations, separate bias current control words can be provided to the negative transconductance circuit 28a and the positive transconductance circuit 28b.

FIG. 3B shows another example schematic diagram of the quality factor tuning circuit 28. Like reference numbers indicate functionally similar elements that can implement any combination of features described with reference to FIG. 3A. A bias voltage can be applied to the negative transconductance circuit 28a and/or the positive transconductance circuit 28b to set the voltage gain of the LNA 20. For instance, a bias voltage $V_{BIAS}$ can be applied to the gate of a transistor in the negative transconductance circuit 28a and/or the positive transconductance circuit 28b via a resistor. The bias voltage can be programmable to different voltage levels, which can thereby provide a programmable voltage gain range for the LNA. The resistor can be an explicit resistor, rather than a parasitic resistance. A capacitor can be coupled between the LC circuit and the gate of the transistor. The resistors and the capacitors can cause the negative transconductance circuit 28a and/or the positive transconductance circuit 28b to have a more linear operating range than the corresponding circuits illustrated in FIG. 3A.

As illustrated in FIG. 3B, the bias voltage $V_{BIAS}$ can be provided to the negative transconductance circuit 28a. The bias voltage $V_{BIAS}$ can be coupled to a first end of a first explicit resistor 52. A second end of the first explicit resistor 52 can be coupled to the gate of the second FET 34. The bias voltage $V_{BIAS}$ can be coupled to a first end of a second explicit resistor 54. A second end of the second explicit resistor 54 can be coupled to the gate of the first FET 32. A first capacitor 56 can be coupled between the second end of the first explicit resistor 52 and the second node OUT−. A first end of the first capacitor 56 can be coupled to the gate of the second FET 34 and the second end of the first explicit resistor 52. A second end of the first capacitor 56 can be coupled to the second node OUT− and the drain of the first FET 32. A second capacitor 58 can be coupled between the second end of the second explicit resistor 54 and the first node OUT+. A first end of the second capacitor 58 can be coupled to the gate of the first FET 32 and the second end of the second explicit resistor 54. A second end of the second capacitor 58 can be coupled to the first node OUT+ and the drain of the second FET 34.

The bias voltage $V_{BIAS}$ can be provided the positive transconductance circuit 28b. The bias voltage $V_{BIAS}$ can be coupled to a first end of a third explicit resistor 60. A second end of the third explicit resistor 60 can be coupled to the gate of the third FET 42. The bias voltage $V_{BIAS}$ can be coupled to a first end of a fourth explicit resistor 62. A second end of the fourth explicit resistor 62 can be coupled to the gate of the fourth FET 44. A third capacitor 64 can be coupled between the second end of the third explicit resistor 60 and the second node OUT−. A first end of the third capacitor 64 can be coupled to the gate of the third FET 42 and the second end of the third explicit resistor 60. A second end of the third capacitor 64 can be coupled to the second node OUT− and the drain of the third FET 42. A fourth capacitor 66 can be coupled between the second end of the fourth explicit resistor 62 and the first node OUT+. A first end of the fourth capacitor 66 can be coupled to the gate of the fourth FET 44 and the second end of the fourth explicit resistor 62. A second end of the fourth capacitor 66 can be coupled to the first node OUT+ and the drain of the fourth FET 44.

The bias voltages provided to the negative transconductance circuit 28a and the positive transconductance circuit 28b can be approximately the same in some implementations or different from each other in other implementations. Approximately the same bias voltage can be provided to each negative transconductance unit 30 in some implementations. Different bias voltages can be provided to two or more negative transconductance units 30 in other implementations. Approximately the same bias voltage can be provided to each positive transconductance unit 31 in some implementations. Different bias voltages can be provided to two or more positive transconductance units 31 in other implementations.

The LNA quality factor can be adjusted based on an indicator of temperature of an integrated circuit (IC) that includes the LNA in some implementations. For example, the IC temperature can be measured using an on-chip temperature sensor and an analog-to-digital converter (ADC). A value indicative of the IC temperature, such as an ADC code, can be stored in a look-up table (LUT) or other non-volatile memory.

As mentioned earlier, the RSSI measurement from a receiver can be directly proportional to the receiver voltage gain. For example, any variation in the voltage gain of the receiver can translate to variation in the RSSI relative to a nominal RSSI value. The nominal RSSI value can represent an amount of RSSI in the absence of variations, such as temperate variations. The voltage gain of low frequency circuit blocks of the receiver and/or an RF mixer can be accurately stabilized across PVT variations. In such implementations, a significant contributor to the variation of the voltage gain can be the LNA voltage gain and, in particular, the gain of the LC circuit of the LNA. Alternatively or additionally, there can be an initial error in the RSSI measurement due to power losses in the RF front-end. This initial error can be corrected, for example, based on a single RF input power correction to the receiver.

When the quality factor tuning circuit 28 is effectively switched off, a raw variation in RSSI, which can be an indicator of receiver voltage gain, can be determined. Simulation data indicate that raw variation in RSSI can be significant impacted by variation in the LNA gain. In particular, the data indicate that variations in the parasitic resistance $R_{P,LNA}$ of the LNA over temperature can have a significant impact on RSSI.

To stabilize the RSSI across temperature (and consequently the voltage gain of the receiver in some applications), in implementations in which temperature is a significant contributor to the variation, a detector can detect this temperature variation. A transceiver IC can include a temperature detection element configured to digitize the detected an indicator of temperature variation from a nominal temperature. The temperature detection element can include an on-chip ADC configured to detect IC temperature. There can be a linear relationship between IC temperature and the indicator of temperature variation. The indicator of temperature variation can be used for accurately estimating the temperature of the IC.

Based on measurements from the temperature detection element, a quality factor control value for the quality factor tuning circuit 28 can be determined for each temperature between within a desired operating range, for example from −55° C. to 125° C. The quality factor control value can include the select signal and the bias current control word. The settings can maintain the RSSI value close to the nominal RSSI value, which can be approximately −85 dBm in some implementations. A single point correction at the nominal RSSI value can be applied to compensate for losses in the RF front-end and/or measurement setup. The quality factor control value can be determined based on the absolute value of the device temperature being applied to the temperature detection element and a relationship between quality factor tuning circuit settings and RSSI. The quality factor control value for the quality factor tuning circuit 28 can be determined at each temperature based on a conversion from a measured indicator of temperature. For instance, where there is a linear relationship, the settings can be determined by multiplying the measured indication of temperature by a slope and adding an intercept and/or using a LUT. Simulation results indicate that applying the quality factor control value to the quality factor tuning circuit should result in an improvement in RSSI accuracy. In some simulations, RSSI accuracy has improved by about 3.5 dB.

Figure 4:
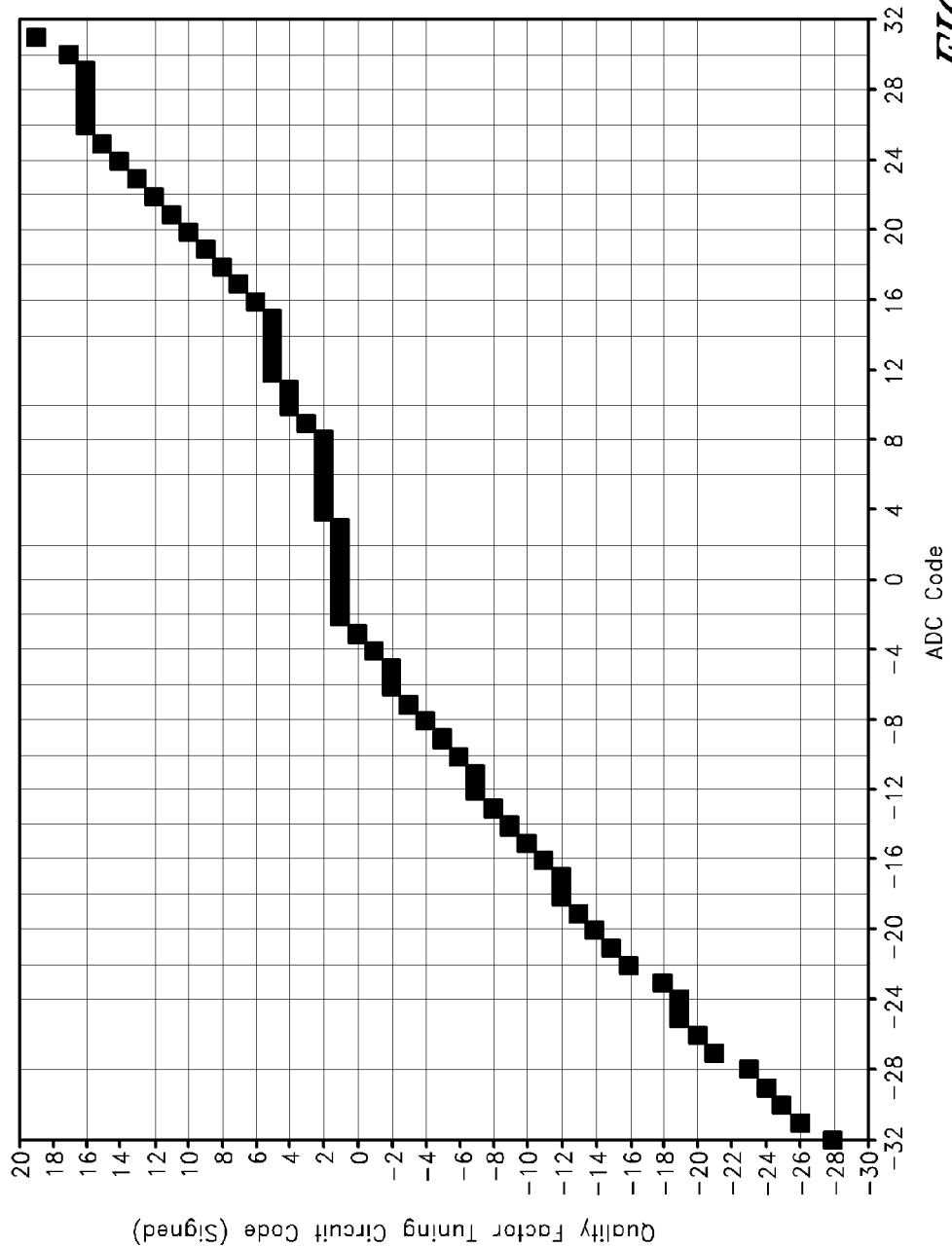
FIG. 4 is a graph that illustrates a relationship among a quality factor control value and an ADC code indicative of IC temperature.

FIG. 4 is a graph that illustrates a relationship among a quality factor control value and an ADC code indicative of IC temperature. The quality factor control value can be represented by the bias current control word and the select signal in some implementations. For example, a sign bit of the quality factor control value can correspond to the select signal and each bit of remaining bits of the quality factor control value can correspond to a bit of the bias current control word and stored in a lookup table (LUT). The select signal can represent a polarity of the quality factor correction, i.e., whether to enable the negative transconductance circuit 28a or the positive transconductance circuit 28b. When an ADC code is provided to the LUT as an address, a corresponding quality factor control value can be read from the LUT. The LUT can be configured such that for each average of the ADC code (which can be indicative of the IC temperature), a quality factor control value can be used. The quality factor control value can be provided to the quality factor tuning circuit 28 to adjust the quality factor of the LC circuit 25. Simulation data indicate that tuning LNA gain with the based on the relationship illustrated in the graph of FIG. 4 can result in a significant reduction of RSSI error. For instance, in some simulations, RSSI error was reduced by about 3.5 to 6 dB compared to not using quality factor correction. RSSI error can be reduced to about 1 to 2 dB in some implementations relative to ideal RSSI values.

In some other implementations, the LNA quality factor can be adjusted based on a measurement of RSSI. For instance, an algorithm can be applied to convert the measurement of RSSI to a quality factor control value for the quality factor tuning circuit 28, which can include the select signal and the bias current control word. More details regarding some example algorithms and adjusting quality factor based on a measurement of RSSI will be provided later, for example, with reference to FIGS. 12-13.

In various implementations, the LNA quality factor can be adjusted based on an indicator of quality factor of a VCO (or other oscillator) that is separate from the LNA. For instance, the VCO quality factor can be detected and then converted to a quality factor control value for the quality factor tuning circuit 28, which can include the select signal and the bias current control word. More details regarding adjusting quality factor based on an indicator of quality factor of a separate VCO will be provided later, for example, with reference to FIG. 9.

Figure 5:
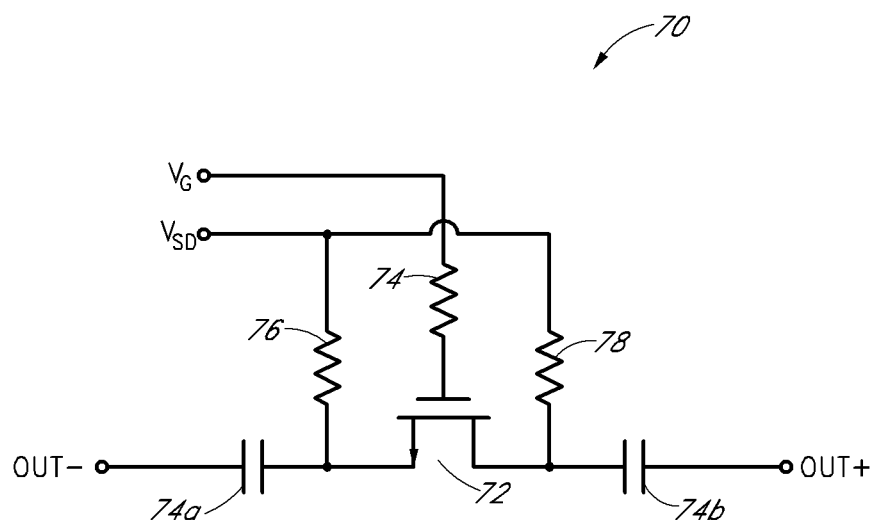
FIG. 5 is a schematic diagram of an example capacitor switching circuit that can be included in the frequency tuning circuit.

Referring to FIG. 5, an example capacitor switching circuit 70 that can be included in the frequency tuning circuit 26 will be described. The frequency tuning circuit 26 can include a plurality of capacitor switching circuits 70 that can each be coupled to the inductor(s) 22a and 22b of the LC circuit 25. The capacitor switching circuits 70 can adjust the resonant frequency of the LC circuit 25 to a frequency within a desired frequency band. Each capacitor switching circuit 70 can be coupled in parallel with each other. Control signal(s) can toggle switches in the capacitor switching circuits 70 to add and/or remove additional capacitance from the effective capacitance of the LC circuit 25. The effective capacitance can represent the combined capacitance of the tunable capacitance elements that are part of the LC circuit circuit and the capacitance of the capacitor(s) 24 in the LC circuit 25. For instance, each capacitor of the capacitor switching circuits 70 can be selectively included or excluded from the effective capacitance of the LC circuit 25 based on values of the capacitance control signals opening and/or closing switches, such as transistors. With additional capacitance, the LC circuit frequency can decrease. Conversely, with reduced capacitance, the LC circuit frequency can increase.

FIG. 5 depicts a single capacitor switching circuit 70. A switch 72, such as a field effect transistor, can be turned on or off by applying voltages to terminals of the switch 72 via resistors 74, 76, and 78. For instance, a gate bias voltage $V_G$ can be applied to the gate of the switch 72 via a first resistor 74. Second and third resistors 76 and 78, respectively, can pull the source and drain terminals, respectively, of the switch 72 to a source-drain bias voltage $V_{SD}$. In some implementations, the switch is an n-type field effect transistor, such as an NMOS device. In these implementations, the switch 72 can be switched on by applying the bias voltage $V_G$ at a voltage level that is higher that the source-drain bias voltage $V_{SD}$ at the source and drain of the switch 72. Turning on the switch 72 can couple one or more capacitors 74a and 74b in parallel with the capacitance of the LC circuit 25. The one or more capacitors 74a and 74b can be switched out from across the LC circuit 25 by turning off the switch 72. When the switch is an n-type field effect transistor, applying a bias voltage $V_G$ to the gate of the switch 72 at a voltage level that is lower than the source-drain bias voltage $V_{SD}$ at the source and the drain of the switch 72 can turn off the switch 72.

In some implementations, a functionally similar capacitor switching circuit 70 can be used in an LC circuit of a voltage-controlled oscillator (VCO) that is separate from the LNA 20. The capacitance of the one or more capacitors in a switching circuit of the LC circuit of the VCO can be scaled relative to the corresponding one or more capacitors 74a and 74b included in the switching circuit 70 of the LC circuit 25 of an LNA. The frequency of the zero imaginary component of the impedance across the LC circuit 25 of the LNA 20 can be tuned based on the separate VCO. In this way, the resonant frequency of the LC circuit 25 of the LNA 20 can be tuned. Such tuning can compensate for variations, such as process variations, and stabilize gain or the LNA 20.

Figure 6:
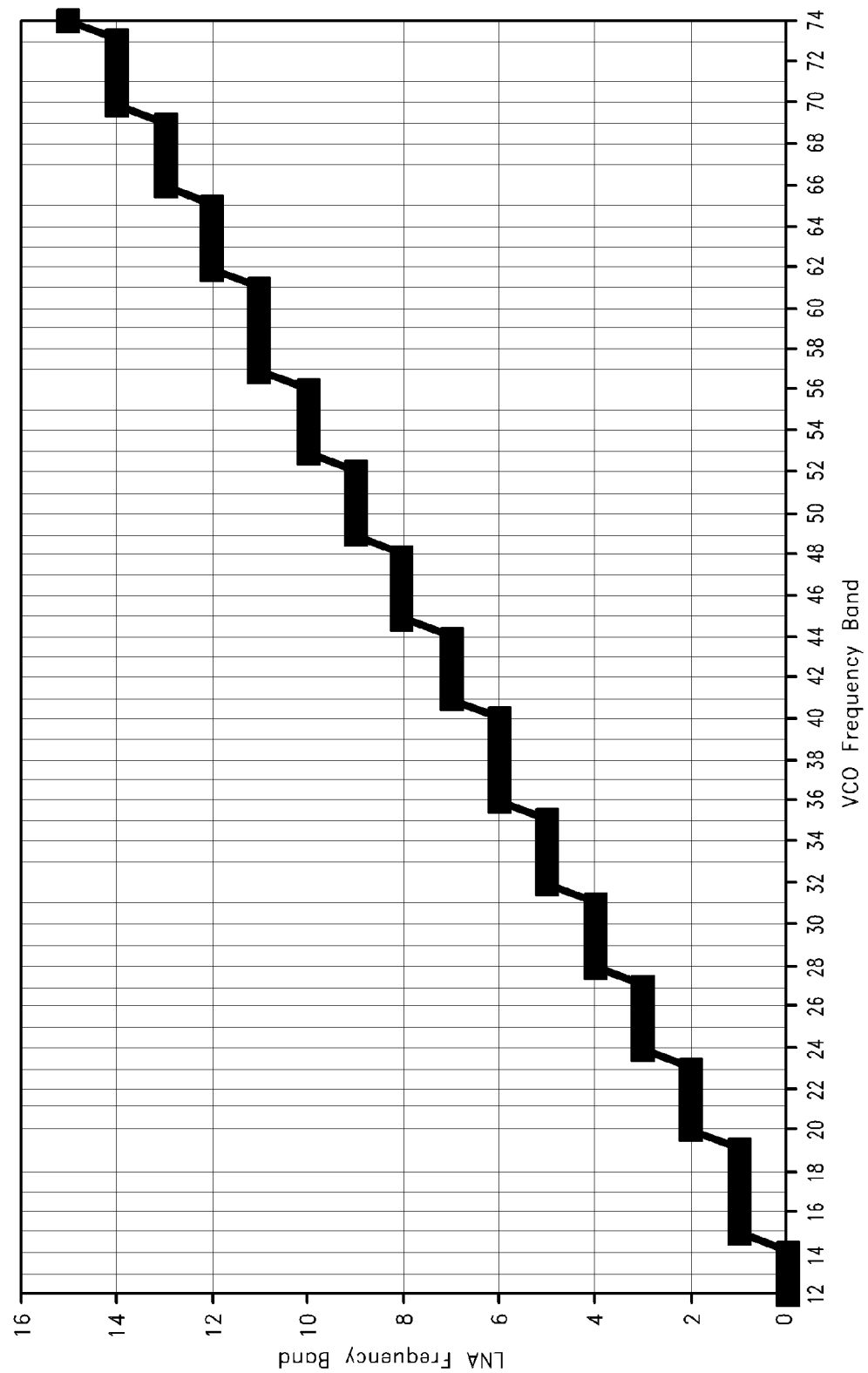
FIG. 6 is a graph that illustrates a relationship among LNA frequency bands and VCO frequency bands after frequency tuning.

FIG. 6 is a graph that illustrates a relationship among LNA frequency bands and VCO frequency bands after frequency tuning. The LC circuit of the LNA and the separate VCO can have a different number of frequency bands. For example, in the implementation of FIG. 6, the VCO has 128 frequency bands and the LNA has 16 frequency bands to tune their respective LC circuits. To create 16 frequency bands, the LNA can have a frequency tuning circuit 26 that includes four capacitor switching circuits 70. A linear fitting algorithm can be applied to select an LNA frequency band corresponding to each selected VCO frequency band. The linear fitting can be performed on the VCO frequency bands within a predetermined range of frequency bands, for example, between band 12 and band 74 in the implementation of FIG. 6. When the VCO operates at frequency bands outside of the predetermined range, the LNA frequency band can be set to the lowest band for VCO frequency bands below the predetermined range and to the highest frequency band for VCO frequency bands above the predetermined range.

The VCO operating frequency can be a multiple of LNA operating frequency, for example, 2, 4, 8 or more. This can avoid on chip interference and be taken into account when computing a selected LNA frequency band. The relationship shown in FIG. 6 can be implemented using a look-up table (or other non-volatile memory) or a linear-fitting engine configured to receive the VCO frequency band as an input and generate the selected LNA band as an output. The resonant frequency of the LNA, which can correspond to a maximum LNA gain, can have a linear fit that indicates that the frequency tuning algorithm is accurate. For instance, in some implementations, the LNA resonant frequency (which can be the frequency at which the LNA has a maximum gain) tuning error can have an error of no more than approximately +/−0.5% across the entire frequency tuning range of the VCO. In one implementation, tuning error of +/−0.5% was observed in an example receiver in which the VCO center frequency was varied within the range from 2350 MHz to 2575 MHz.

FIGS. 7-13 depict schematic block diagrams of RF receivers, components thereof, and graphs relating thereto, according to some implementations. With reference to FIGS. 7-13, non-limiting examples of how an LNA frequency can be tuned and/or how LNA quality factor can be adjusted will be described. It will be understood that any combination of features described with reference to FIGS. 7-13 can be applied to tuning frequency and/or adjusting a quality factor of an LC circuit. In these figures, like reference numerals indicate identical or functionally similar elements that can implement any combination of features of the respective blocks described with reference to any of FIGS. 7-13.

Figure 7:
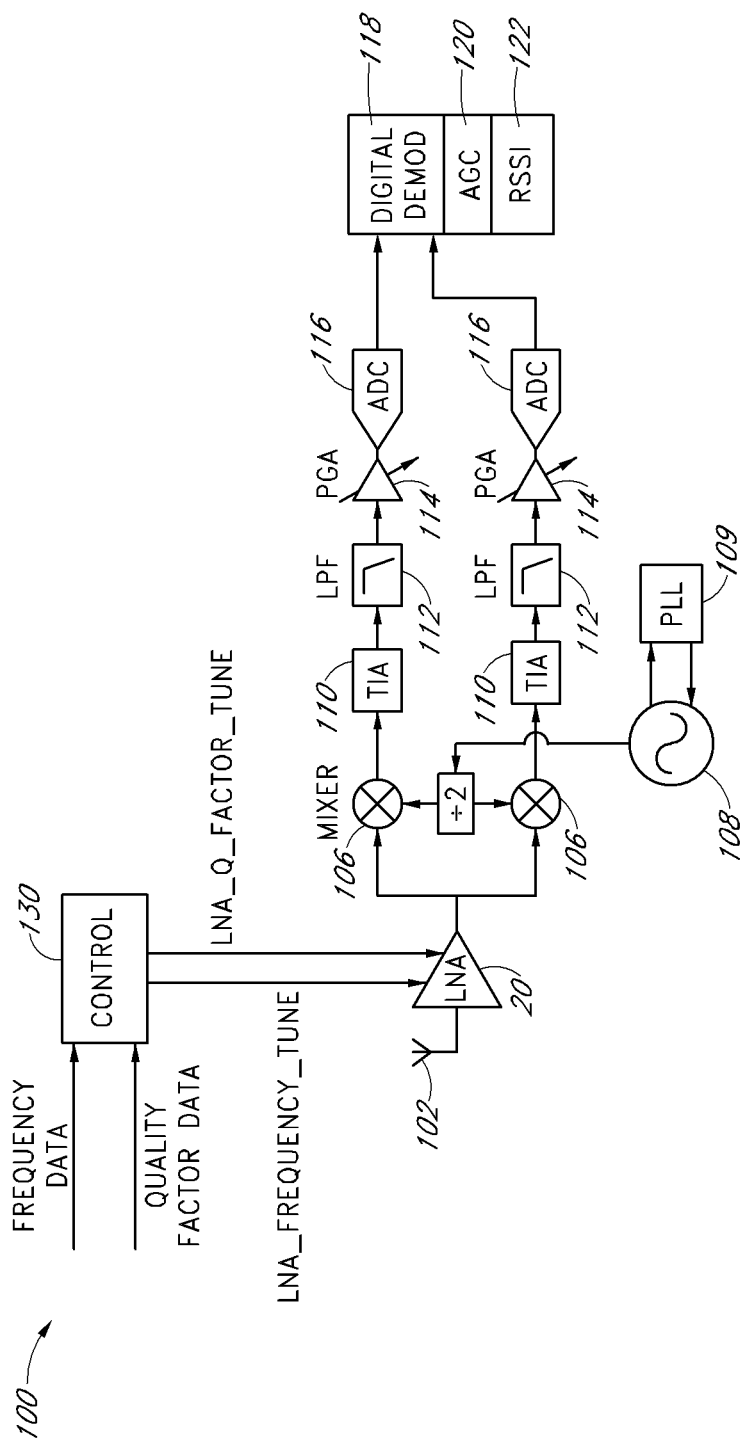

Referring now to FIG. 7, a block diagram of an example RF receiver 100 configured to tune a quality factor and/or a frequency of an LNA will be described. An RF input signal can be received by an antenna 102. The RF input signal can be provided to an LNA 104 via a matching network circuit. The LNA 20 can generate an amplified RF signal. A mixer 106 can obtain the amplified RF signal from the LNA 20. A VCO 108, which is separate from the LNA 20, can drive the mixer 106. The mixer 106 can down-convert the amplified RF signal to a low frequency base-band signal. The mixer 106 can generate two low frequency base-band signals that are 90 degrees out of phase from each other and provide one signal to an in-phase path (I path) and one signal to an out-of-phase path (Q path). The I path and the Q path can include functionally similar elements configured to perform substantially the same operations on the out of phase signals. For ease of description, one path will be described. A low frequency base-band signal can be converted to voltage via a trans-impedance amplifier (TIA) 110. The voltage can be subsequently filtered by a base-band filter 112, such as a low pass filter. In some implementations, the base-band filter 112 can include a real pole stage and a biquad stage. A programmable-gain amplifier (PGA) 114 can adjust the signal level of the base-band filtered signal. An output of the PGA 114 can be digitized by an analog-to-digital converter (ADC) 116.

Signals received at the antenna 102 can have varying amplitudes. The receiver 100 can provide a higher gain in a receive path for signals received at the antenna 102 having a lower amplitude and a lower gain in the receive path for signals with received at the antenna 102 having a higher amplitude. In this way, the receiver 100 can provide signals having approximately the same amplitude regardless of the amplitude of a signal received at the antenna 102.

Several components of the RF receiver 100 can adjust the amplitude of the received RF signal. For example, the LNA 20, the RF mixer 106, the base-band filter 112, and the PGA 114 can have programmable gains to adjust signal amplitude. A digital demodulator 118 can demodulate an output of the ADC 116. An automatic gain control (AGC) system 120 can measure signal strength at the output of the ADC 116 and adjust the gains of the LNA 20, base-band filter 112 (which can be a low pass filter), the PGA 114, or any combination thereof. The AGC system 120 can estimate the RSSI of the received RF signal. An RSSI measurement can be stored in an RSSI memory 122, which can include any suitable memory element.

The RSSI measurement can be computed from a gain of the RF receiver 100. The gain of the RF receiver 100 from an input (for example, at the antenna 102) to an output (for example, the output of the ADC 116) can be determined from gains of individual components. The individual gains of several components can be computed within an acceptable accuracy for most components of the RF receiver 100. However, determining the gain of the LNA 20 within a desired accuracy has proved difficult.

The gain of the LNA 20 can be computed, for example, based on Equation 1 provided above. A control block, such as an LNA control 130 can control the parasitic resistance $R_{P,LNA}$ of the LNA 20 by adjusting conductance across the LC circuit 25 of the LNA 20 based on frequency data and/or quality factor data. The frequency data can include any of the data for tuning LNA frequency described herein, for example, as will be described with reference to FIGS. 8, 9, and 11-13. The quality factor data can include any of the data for adjusting the quality factor of the LNA described herein, for example, as will be described with reference to FIGS. 8, 9, and 11-13. The LNA gain can be stabilized by tuning the quality factor and/or resonant frequency. Stabilizing the gain of the LNA 20 via the LNA control 130 can increase the accuracy of the measured RSSI. As a result, in some implementations, a location of a device including the receiver 100 can be improved.

Figure 8A:
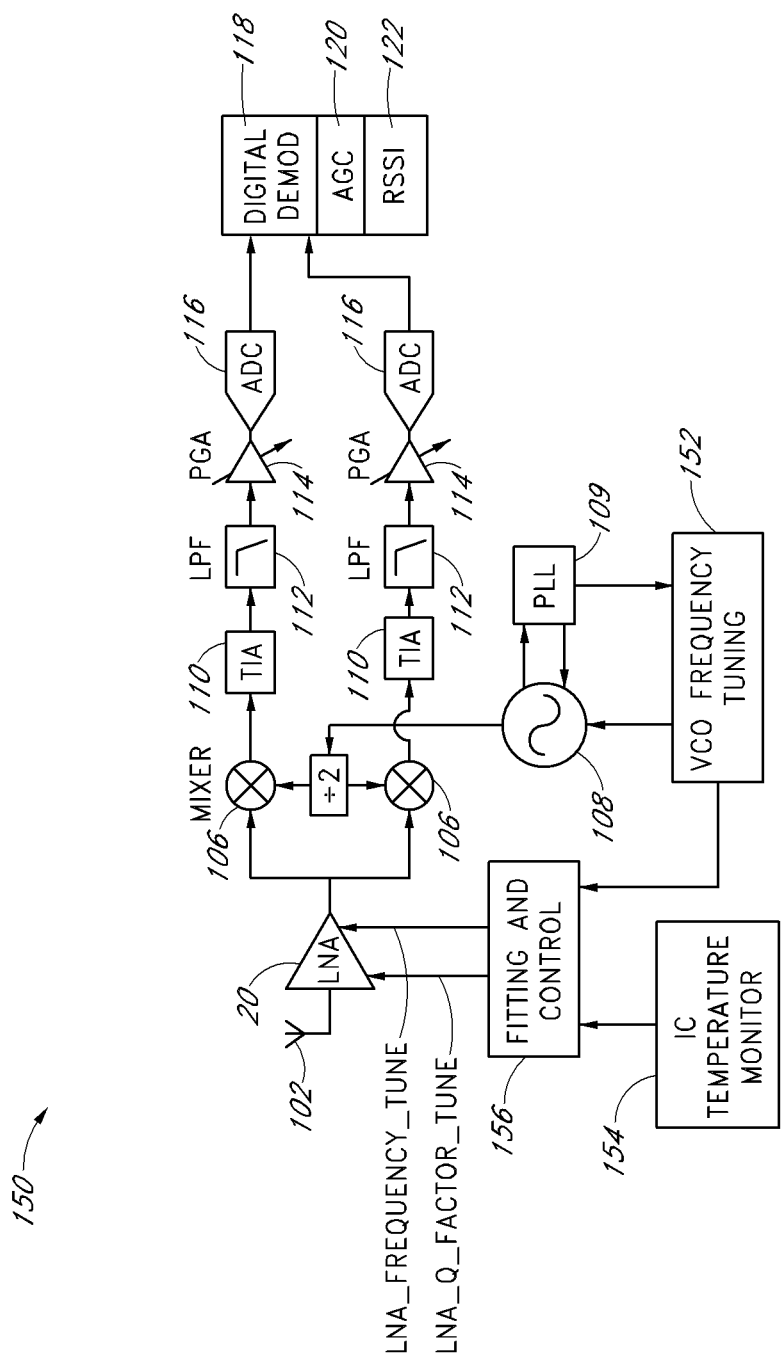
FIG. 8A is a block diagram of another example RF receiver in which quality factor of the LC circuit of the LNA can be tuned based on a detected temperature of an IC that includes the RF receiver and/or frequency of the LC circuit of the LNA can be tuned based on tuning data generated for a separate VCO.

FIG. 8A depicts another example RF receiver 150 in which quality factor of the LC circuit 25 of the LNA 20 can be tuned based on a detected temperature of an IC that includes the RF receiver 150 and/or frequency of the LC circuit 25 of the LNA can be tuned based on tuning data generated for a separate VCO 108. In the implementation of FIG. 8A, the resonant frequency of the LC circuit 25 of the LNA 20 can be tuned based on an output of a VCO frequency tuning block 152 that is configured to adjust the frequency of the VCO 108. For instance, the frequency tuning block can select a frequency band of operation for the VCO 108 by selectively activating switching circuits, such as the switching circuits 70, to adjust the resonant frequency of the VCO 108. The output of the VCO frequency tuning block 152 can be indicative of a VCO frequency band of operation. Alternatively or additionally, the quality factor of the LC circuit 25 of the LNA can be tuned based on an indicator of IC temperature generated by an IC temperature monitor 154 or any other suitable temperature detection element.

A fitting and control block 156 can receive the signal indicative of a VCO frequency band of operation and/or the indicator of IC temperature. The fitting and control block 156 can be configured to process digital signals. Such a fitting and control block 156 can be referred to as a digital fitting and control block. The fitting and control block 156 can perform linear (and/or polynomial) fitting on the received signals. For example, the signal indicative of a VCO frequency band of operation can be fit to an LNA frequency tuning value based on the relationship shown in FIG. 6 or any other suitable correlation. The LNA frequency tuning value can include voltages configured to turn switches 72 on or off in one or more capacitor switching circuits 70 of the frequency tuning circuit 26. This can adjust the resonant frequency of the LC circuit 25 to a desired frequency band, for example, as described with reference to FIGS. 2 and 5. Adjusting the resonant frequency of the LC circuit 25 can tune a frequency of a zero imaginary component of an impedance across the LC circuit 25 to a desired frequency based on a frequency of operation selected for the receiver 150. As another example, the signal indicative of IC temperature can be fit to an LNA quality factor tuning value based on the relationship shown in FIG. 4 or any other suitable correlation. The LNA quality factor tuning value can include a bias current control word and a select signal provided to a quality factor tuning circuit 28. The select signal can represent a polarity/sign of quality factor tuning. The LNA quality factor tuning can adjust the conductance across the LC circuit 25 to adjust for variations in parasitic resistance across an LC circuit, for example, as described with reference to FIGS. 2, 3A, and 3B.

Figure 8B:
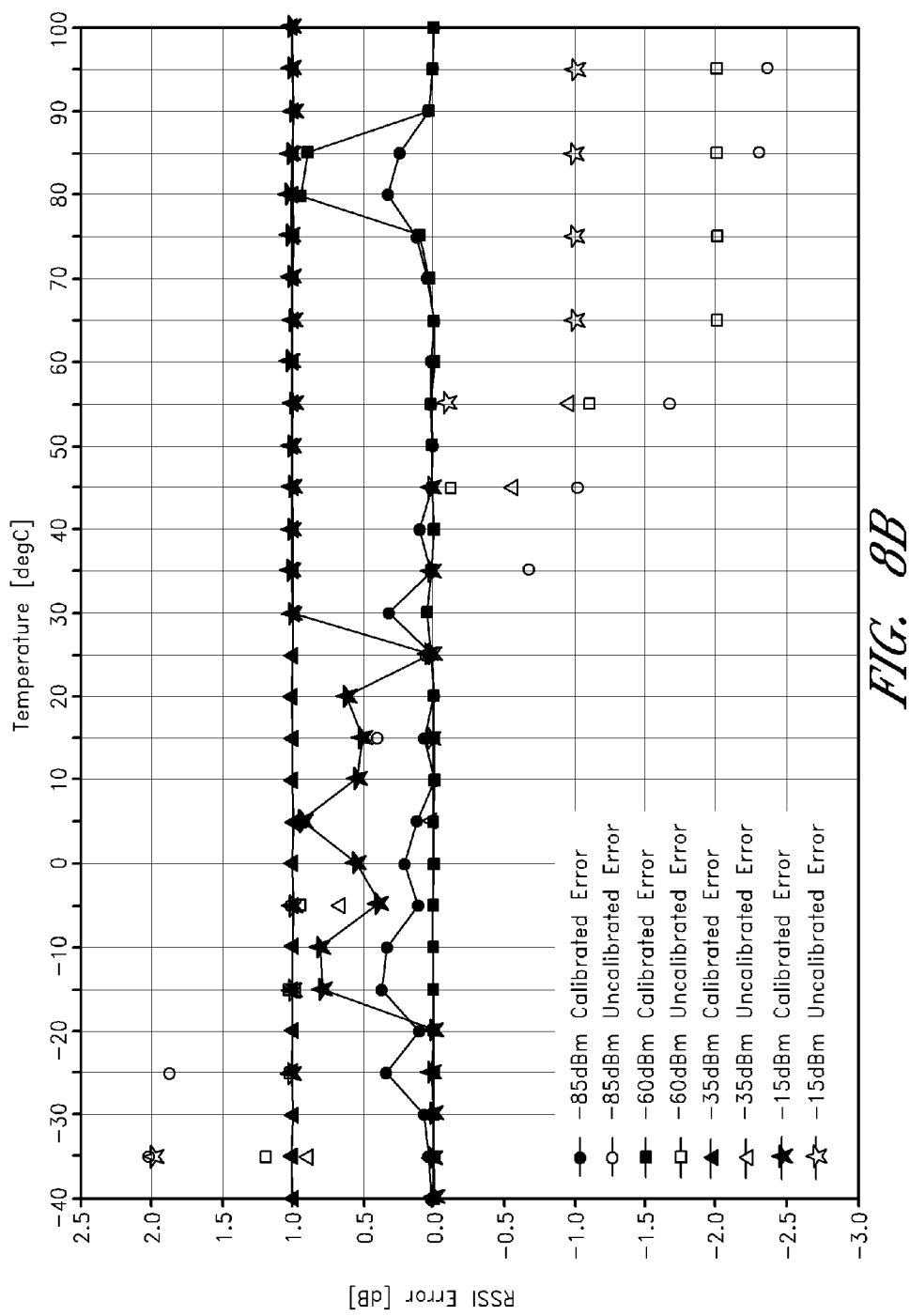
FIG. 8B is a graph that illustrates a relationship among temperature and received signal strength indication (RSSI) error at multiple power levels of the example receiver of FIG. 8A.

FIG. 8B is a graph that illustrates a relationship among temperature and received signal strength indication (RSSI) error at multiple power levels of the example receiver of FIG. 8A. RSSI error was measured before (uncalibrated) and after (calibrated) quality factor tuning at RF input power levels of −85 dBm, −60 dBm, −35 dBm, and −15 dBm for a 500 kHz base-band frequency tone. A single point correction at −85 dBm was applied to compensate for losses in the RF front-end and measurement setup. The tuning (calibration) was performed based on IC temperature data generated by the IC temperature monitor 154 and a LUT in the fitting and control block 156 in accordance with the relationship shown in FIG. 4. In the LUT, IC temperature data which is used such that for each average of ADC read-back (which can be temperature dependent), a selected setting for tuning quality factor tuning, for example, with a circuit functionally similar to the circuit of FIG. 3A, circuit is used.

To generate the data shown in FIG. 8B, temperature was swept in increments of 5° C. and RSSI error was measured relative to RF input power levels of −85 dBm, −60 dBm, −35 dBm, and −15 dBm. Quality factor tuning settings were determined at each temperature based on a LUT in the fitting and control block 156 in accordance with the relationship shown in FIG. 4. As shown in FIG. 8B, without tuning (uncalibrated RSSI), there was a total variation of approximately 4.5 dB in the RSSI measurement. As also shown in FIG. 8B, higher RSSI error was observed at higher temperatures. The quality factor tuning, using a circuit functionally similar to FIG. 3B, reduced the total variation in calibrated RSSI error to approximately 1 dB. Thus, quality factor tuning resulted in an improvement of approximately 3.5 dB for the tested receiver. Such an improvement is consistent with improvements observed from using the absolute value of the IC temperature for tuning quality factor.

Figure 8C:
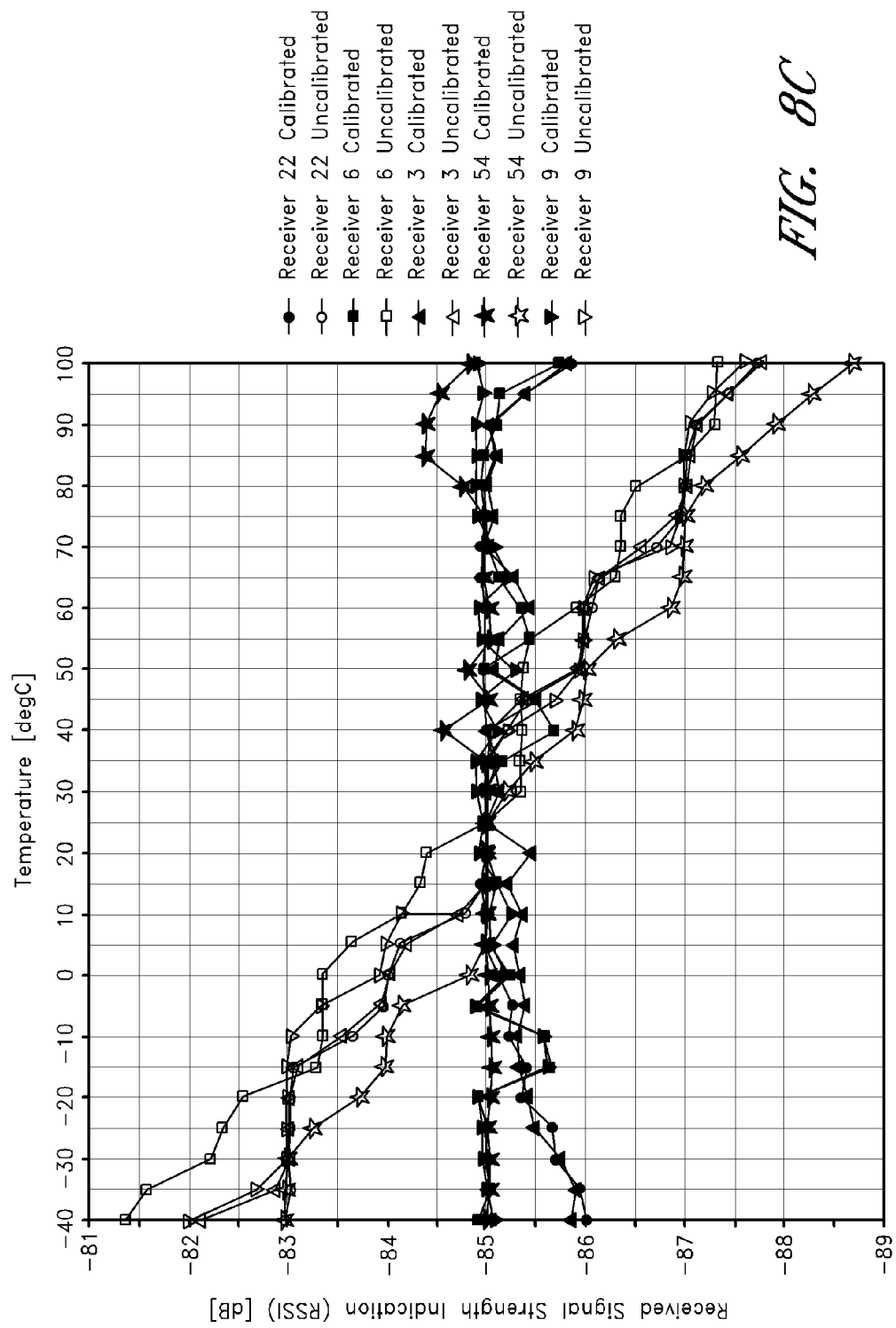
FIG. 8C is a graph that illustrates a relationship among temperature and RSSI for multiple devices of the example receiver of FIG. 8A.

FIG. 8C is a graph that illustrates a relationship among temperature and RSSI for multiple devices of the example receiver of FIG. 8A. The graph in FIG. 8C shows measured RSSI before and after quality factor tuning (calibration) for an RF input power level of −85 dBm for 500 kHz base-band frequency tone versus temperature for five different receivers. A single point correction at −85 dBm was applied to compensate for losses in the RF front-end and measurement setup. As shown in FIG. 8C, the total variation in RSSI is approximately 7.5 dB before tuning (uncalibrated). Using the quality factor tuning settings based on the relationship shown in FIG. 4 for all five receivers, a total RSSI error of about 1.8 dB across all five receivers was observed. This improvement of almost 6 dB across all five receivers can be significant in certain implementations.

Figure 9:
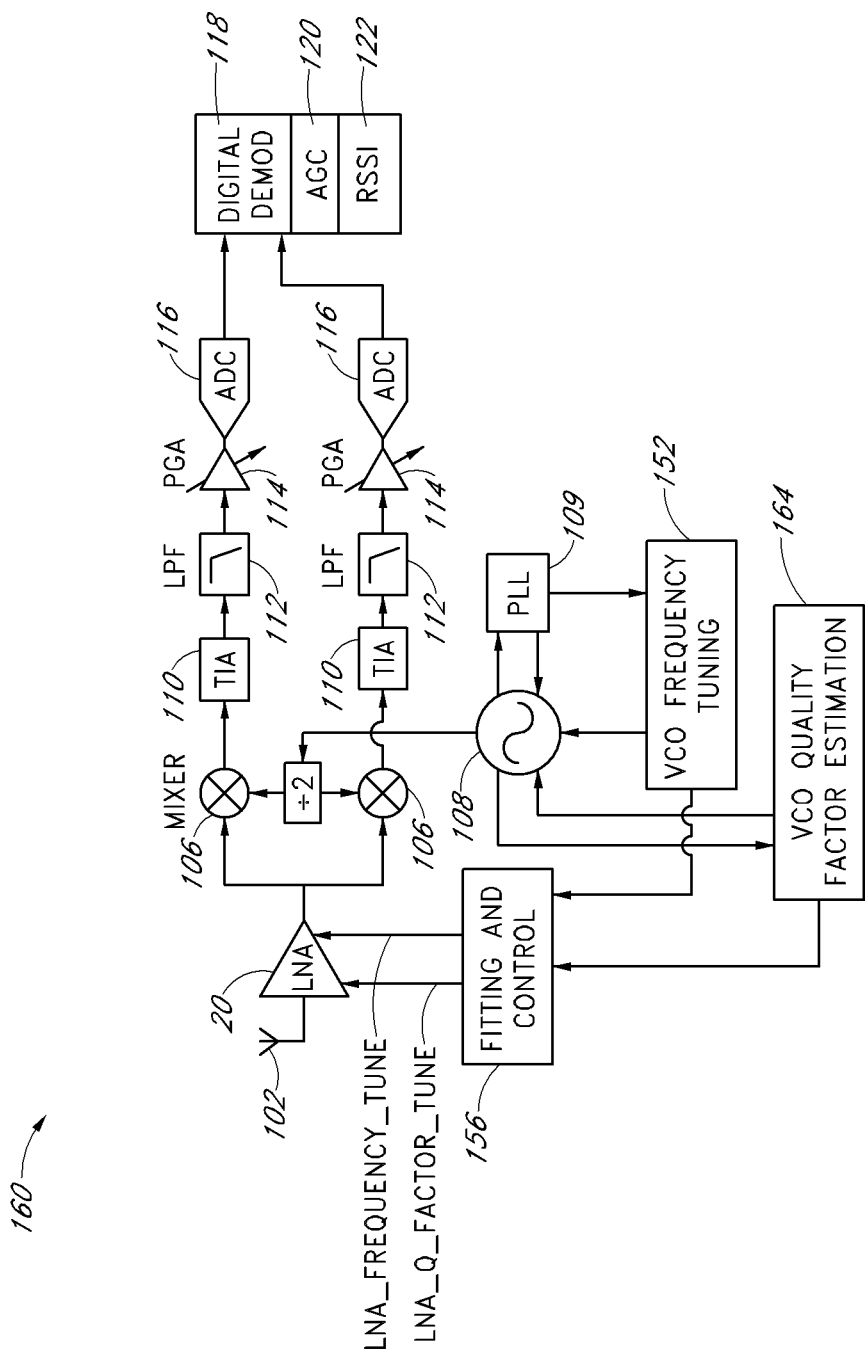

FIG. 9 depicts another example RF receiver 160 that is configured to use a separate VCO 108 for tuning a resonant frequency of the LC circuit 25 of the LNA 20 and/or to detect variation in circuit quality factor of the LC circuit 25 of the LNA 20. The RF receiver 160 can include a VCO quality factor estimation block 164 instead of or in addition to the IC temperature monitor 154 of the receiver 150 of FIG. 9. The fitting and control block 156 can generate the LNA quality factor tuning value based on VCO quality factor estimation information generated by the quality factor estimation block 164.

Figure 10:
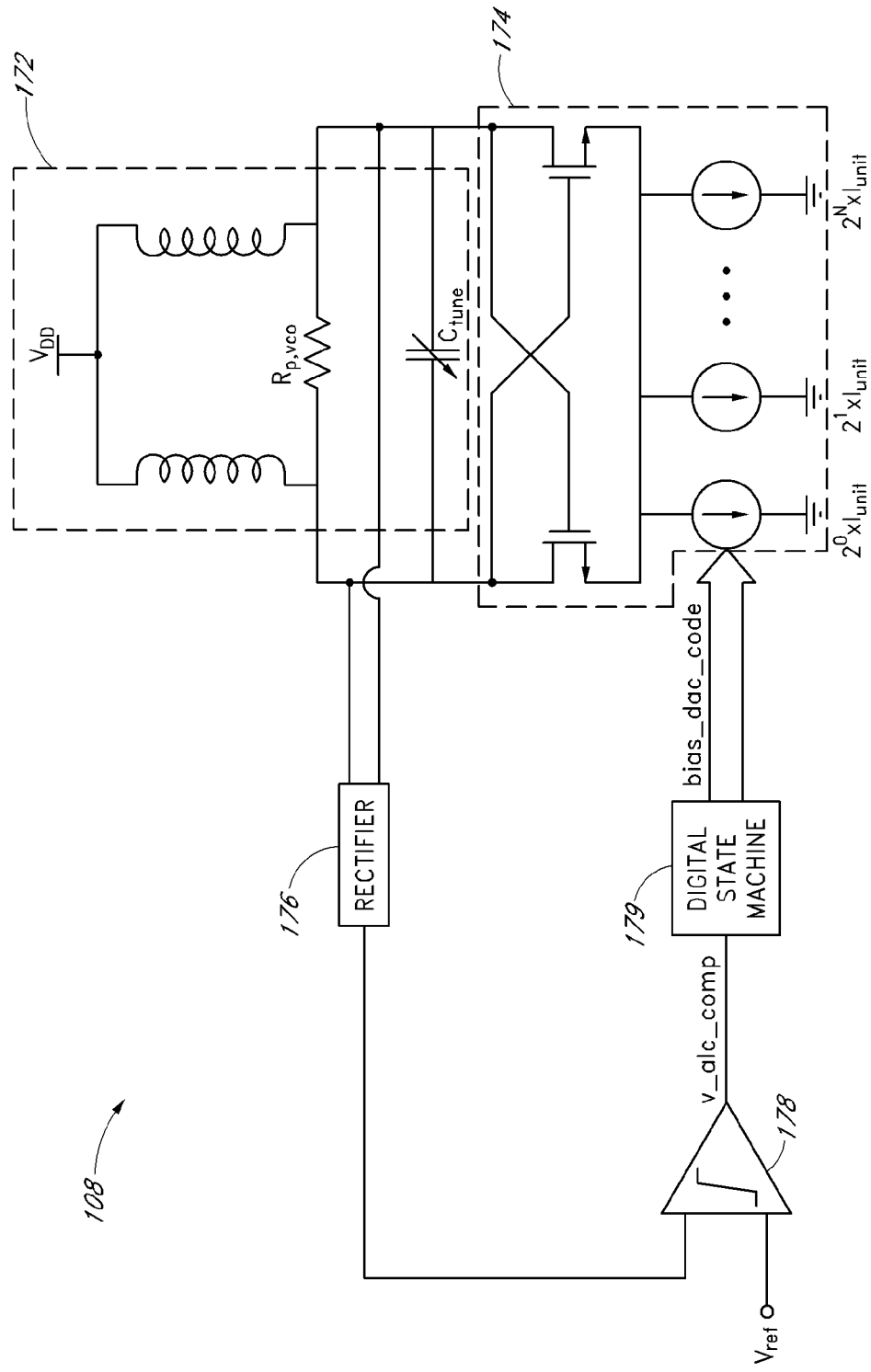

In some implementations, both the quality factor and the frequency of the LC circuit 25 of the LNA can be tuned based on an oscillator, such as the VCO 108, that is separate from the LNA 20. FIG. 10 is a block diagram of an example implementation of a VCO 108 that can detect variations in quality factor. The VCO 108 can include an LC circuit 172 and a negative conductance circuit 174. The negative conductance circuit 174 can include an NMOS transistor sustaining amplifier, for example, as shown in FIG. 10. Losses in the LC circuit 172 can be modeled by the parasitic resistive $R_{P,VCO}$. The negative conductance provided by the sustaining amplifier can compensate for the energy losses and/or dissipation in the LC circuit 172 and sustain the VCO oscillation at a resonant frequency. The LC circuit 172 of the VCO 108 can be a scaled replica of the LC circuit 25 of the LNA 20 in some implementations.

The frequency of the LC circuit 172 can be tuned by a frequency tuning circuit, which can include any combination of features described with reference to the frequency tuning circuit 26. After the VCO 108 is tuned to a desired frequency, a linear-fitting algorithm can be applied to set a desired LNA frequency band, for example, via the fitting and control block 156.

The VCO 108 can include an amplitude level control (ALC) loop configured to stabilize the amplitude of the VCO 108 across temperature variations, process variations, supply voltage variations, the like, or any combination thereof. The ALC loop can include a rectifier 176 having inputs coupled to opposing sides of the LC circuit 172. The ALC loop can also include a comparator 178 configured to compare an output of the rectifier 176 with a programmable reference voltage $V_{REF}$. A digital state machine 179 can generate a bias DAC code based on the output of the comparator 178. The digital state machine 179 can implement, for example, a successive approximation (SAR) algorithm to generate the bias DAC code. The bias DAC code can control the amplitude of the VCO 108 by selectively controlling current sources configured to bias the sustaining amplifier of the negative conductance circuit 174. For example, the bias DAC code can be provided to the VCO bias DAC.

The quality factor of the LC circuit 172 of the VCO 108 can be estimated after a frequency tuning phase of operation in which the digital state machine 179 iterates through some or all possible bias DAC codes of the VCO 108. The digital state machine 179 can monitor the output of the comparator 178. At a particular VCO bias DAC code, the output of the comparator 178 transitions from a logic "0" to a logic "1." This particular bias DAC code can be an indicator of the quality factor of the LC circuit 172. At this particular bias DAC code, the amplitude of an output of the VCO 108 can be approximately equal to a target amplitude set by the programmable reference voltage $V_{REF}$ provided to the comparator 178. The target amplitude can be set to be just above a voltage level that should lead to the onset of the oscillation of the VCO 108. As a result, the voltage swing across the negative conductance circuit 174 can be relatively small. This can keep the negative conductance circuit 174, which is configured to sustain oscillation the VCO 108, in a linear range of operation. For a nominal quality factor for the LC circuit 172, i.e., a quality factor corresponding to nominal losses in the LC circuit 172, there can be a given bias current used to sustain oscillation of the VCO 108. If the temperature increases, the losses in the LC circuit 172 can increase, which can cause the parasitic resistive $R_{P,VCO}$ of the VCO to decrease. As a result, more bias current can be used to sustain oscillation of the VCO 108. Conversely, less bias current can be used to sustain oscillation of the VCO 108 if the temperature decreases since the value of the parasitic resistance $R_{P,VCO}$ of the VCO 108 can increase with the decrease in temperature.

The VCO bias DAC code at which the onset of oscillation is detected can also be indicative of variations in the quality factor of the LC circuit 25 of the LNA 20. Accordingly, the fitting and control block 156 of FIG. 9 can determine the LNA quality factor tuning value by applying a fitting algorithm to the VCO bias DAC code at which the onset of oscillation is detected. The fitting algorithm can determine when the VCO bias DAC code exceeds a nominal value that corresponds to nominal losses in the LC circuit 172. The VCO bias DAC code exceeding the nominal value can be indicative of more losses in the LC circuit 25 of the LNA 20. Then the quality factor tuning circuit 28 can adjust the quality factor of the LC circuit 25 of the LNA 20 closer to the nominal value by increasing the negative conductance across the LC circuit 25 of the LNA 20 based on the LNA quality factor tuning value. On the other hand, when the VCO bias DAC code is less than the nominal value, which can be indicative of less loss in the LC circuit 25 of the LNA 20, the positive conductance across the LC circuit 25 of the LNA 20 can be increased by the quality factor tuning circuit 28 to tune the quality factor to be close to the nominal value based on the LNA quality factor tuning value.

The quality factor estimation methods described above can detect losses in the LC circuit 172 due to previous frequency tuning. In the LC circuit 172, the switch used to couple a frequency band capacitor across the LC circuit 172 can have an associated on-resistance, which can contribute to the losses in the LC circuit 172. The on-resistance can have a larger effect in some wide-bandwidth VCO designs, for example.

As discussed above, the VCO bias DAC code at which the output of the comparator transitions from a logic "0" (for example, at 0V) to a logic "1" (for example, at 1.8V) can correspond to the onset of oscillation of the VCO 108 and consequently an indicator of the quality factor of the LC circuit 172. At higher than nominal temperatures, the VCO bias DAC code can be increased to compensate for the losses in the LC circuit 172 relative to the nominal. Conversely, at lower than nominal temperatures, the bias DAC code can be decreased.

When more capacitors are switched in across the LC circuit 172, more losses can be introduced in the LC circuit 172. Likewise, when fewer capacitors are switched in across the LC circuit 172, less loss may be introduced in the LC circuit 172. Accordingly, the VCO bias DAC code at the onset of oscillation can be higher for higher frequency bands in which more capacitors are switched in across the LC circuit 172. This can be due to the increased on resistance of the switches that switch in the capacitors. The opposite can occur for lower frequencies where a decrease in on resistance of switches configured to switch in capacitors across the LC circuit 172 can result in a lower VCO bias DAC code. Consequently, a quality factor estimation circuit, such as the VCO quality factor estimation block 164 of FIG. 9, can accurately estimate quality factor in the presence of frequency related quality factor losses.

Figure 11:
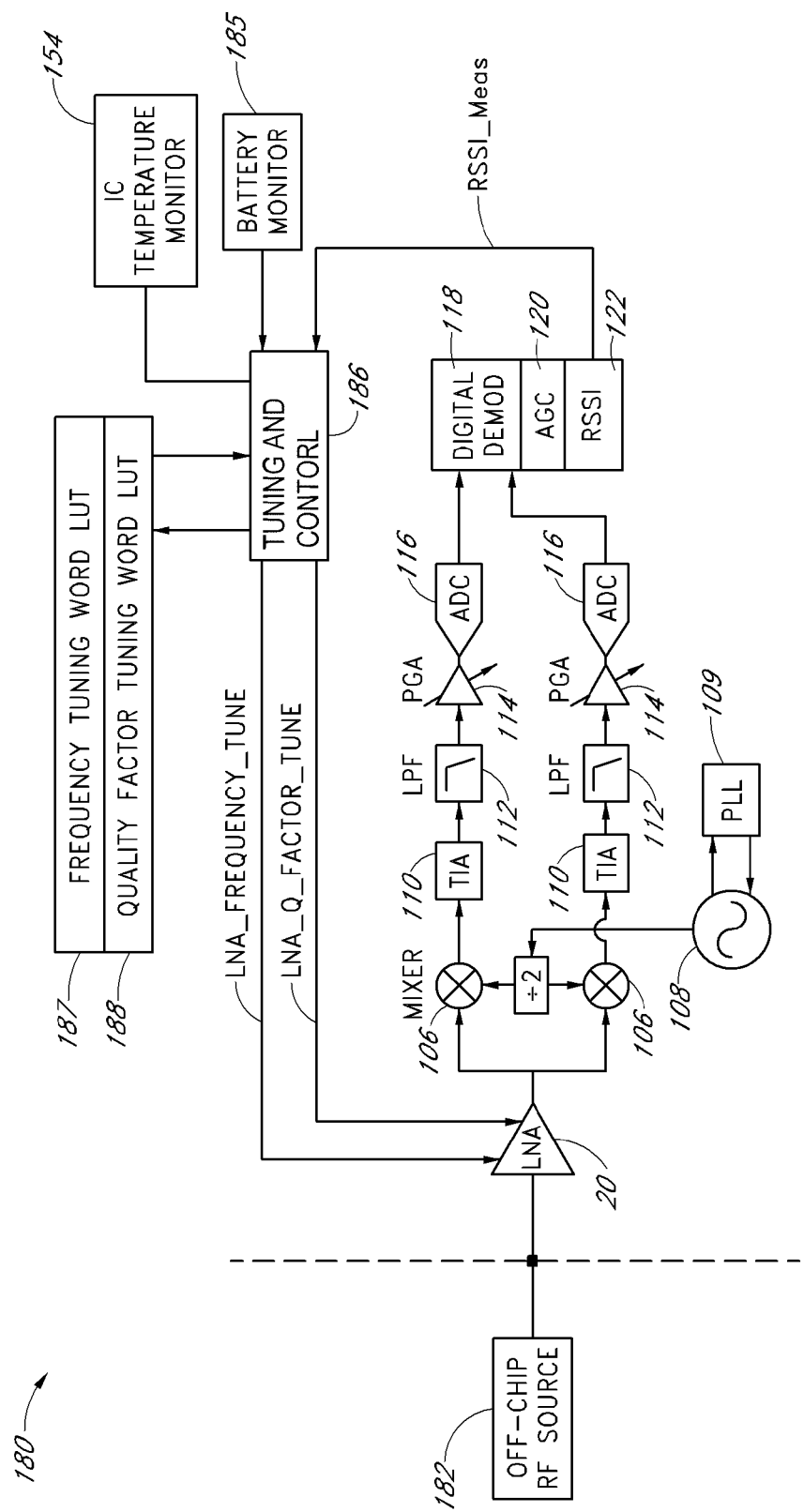
Figure 12:
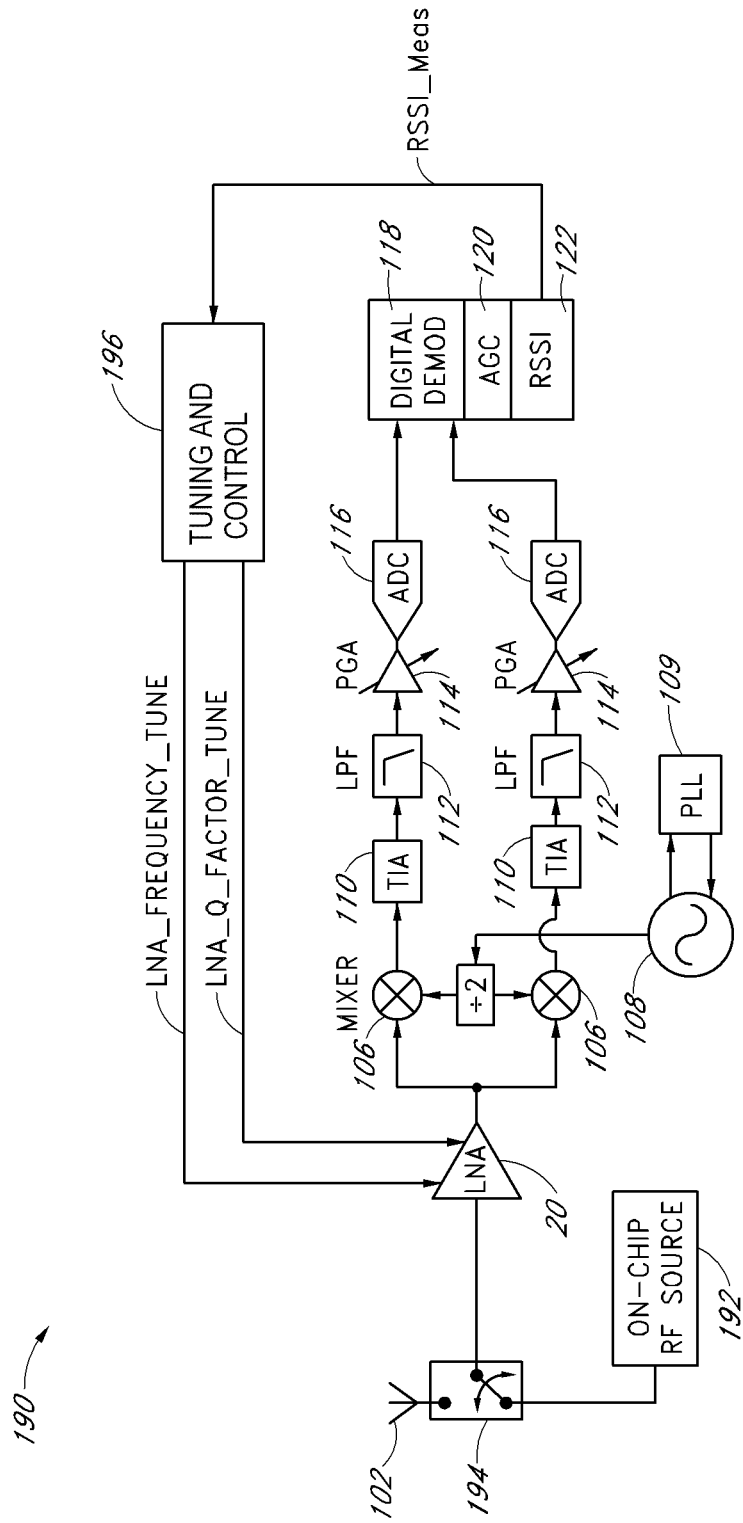
Figure 13:
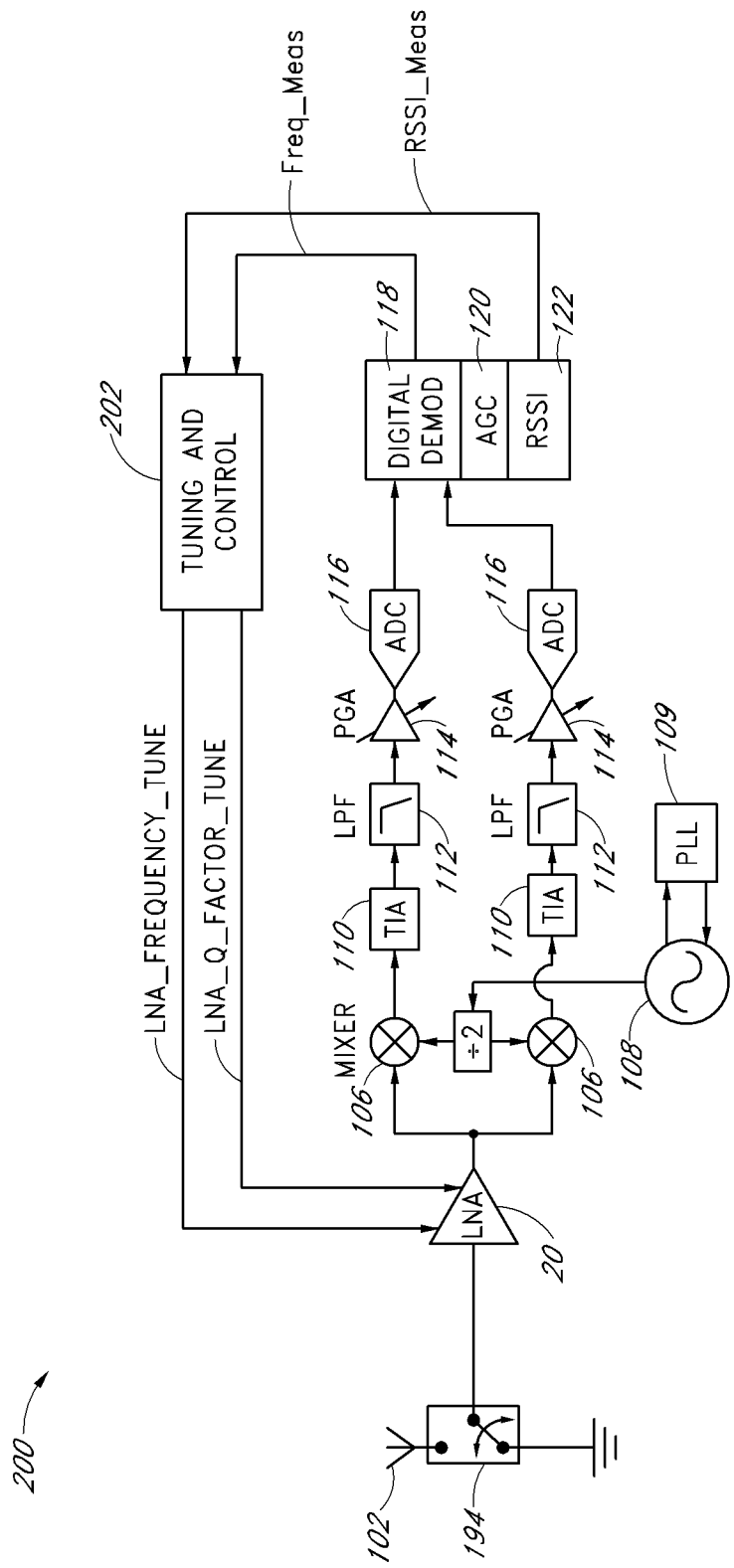

The frequency and quality factor tuning in the RF receiver 150 of FIG. 8A and the RF receiver 160 of FIG. 9 are based on open-loop systems configured to detect a variation in a performance aspect (for example, frequency and/or quality factor tuning errors). In these implementations, there can also be a fitting algorithm to compute the selecting tuning values for an LC circuit (for example, the LC circuit 25 of the LNA 20) with performance parameters to be tuned. Some other implementations can include a feedback mechanism to assess the impact of tuning after the tuning values are applied to the LC circuit relative to the un-tuned performance of the LC circuit before applying the tuning values. FIGS. 11-13 provide three example receivers that include a closed feedback loop, which can enable a measurement to be made on the performance parameter that is being tuned after applying the tuning values.

FIG. 11 is a block diagram of an example RF receiver 180 configured to receive an external off-chip RF source at an input of the LNA 20 for frequency tuning and/or quality factor tuning. During a tuning phase of operation, the off-chip RF source 182 can operate at a specified RF power level and the RSSI can be measured by the RF receiver 180. Since the applied RF power from the external RF source can be known, a target RSSI value can be established for a tuning algorithm. Based on the RSSI measurement generated by the AGC system 120 and/or stored in the RSSI memory 122, a 2D Successive Approximation (SAR) and/or a linear search algorithm can be used to determine the LNA frequency tuning value and/or the LNA quality factor tuning value. While traditional SAR search algorithms operate on a single parameter, a 2D SAR search algorithm has been disclosed in the context of an image rejection calibration scheme in U.S. patent application Ser. No. 11/881,019, filed Jul. 25, 2007 by Quinlan, et al., published as U.S. Patent Publication No. 2008/0132191, titled "Image Rejection Calibration System," assigned to the same assignee as the present application, which is hereby incorporated by reference herein in its entirety. The 2D SAR algorithm can determine selected tuning values that reduce the error in measured RSSI below a predefined threshold and/or minimize the error in the measured RSSI.

With an off-chip RF source 182, the frequency tuning and/or quality factor tuning can be performed on an IC that includes the RF receiver 180 during production of the hardware platform that includes the IC. The frequency tuning value and/or the quality factor tuning value can be stored on the IC in a LUT or other suitable non-volatile memory. As one example, the LUT can be a non-volatile memory such as a FLASH memory. The LUT can include a frequency tuning word LUT 187 and a quality factor tuning word LUT 188, as illustrated in FIG. 11.

The frequency tuning and/or quality factor tuning can be performed on each IC in production. Accordingly, tuning with an off-chip RF source 182 can take into account process variations. However, the temperature of the IC during production may be different from the operating temperature of the IC in a target application. The effect of temperature variations in the target application can be accounted for during the tuning phase of operation by sweeping the IC temperature and storing the frequency tuning value and/or the quality factor tuning value for each IC for a number of temperatures across the operating temperature range of the IC. For example, if the IC is configured to operate within a temperature range (for example, between −40° C. and 85° C.) in a target application, the tuning values can be stored for at set increments (such as 5° C. or 10° C. increments) within the temperature range. When the IC is used in the field, an IC temperature monitor 154 can detect the operating temperature of the IC. A tuning and control circuit 186 can select a desired frequency tuning value and/or a desired quality factor tuning value based on the detected operating temperature of the IC. The tuning and control circuit 186 can implement any suitable algorithm, such as a 2D SAR and/or a linear search algorithm, to determine the quality factor tuning value and/or the frequency tuning value.

Alternatively or additionally, the supply voltage at which the IC operates during production while the frequency tuning and/or quality factor tuning is performed can be different from the supply voltage in an application in the field. Accordingly, the frequency tuning value and/or the quality factor tuning value can also be stored at different supply voltage levels. These tuning values can be selected based on an indicator of a voltage value of the supply voltage, for example, as generated by a battery monitor 185. The battery monitor 185 can provide an indicator of a voltage level of the supply voltage to the tuning and control circuit 186. The tuning and control circuit 186 can then read a selected frequency tuning value and/or quality factor tuning value from the LUT corresponding to the indicator of the voltage level of the supply voltage generated by the battery monitor 185.

Another way of tuning the frequency and/or quality factor of the LC circuit 25 can include using an internal on-chip RF source. FIG. 12 depicts an example RF receiver 190 that includes an on-chip RF source 192 coupled to an input of the LNA 20 for frequency and/or quality factor tuning. A switch 194 can selectively couple the antenna 102 or the on-chip RF source 192 to an input of the LNA 20. For instance, the switch 194 can electrically couple the on-chip RF source 192 to the input of the LNA 20 when the IC is in a tuning phase of operation and the switch 194 can electrically couple the antenna 102 to the input of the LNA 20 during a phase of operation in which the receiver receives RF signals. The RF receiver 190 can determine the frequency tuning value and/or the quality factor tuning value in the presence of process, supply voltage and temperature variations since the tuning algorithm can be performed on each IC while operating in the target application. Accordingly, a LUT or other non-volatile memory for the frequency tuning value and/or the quality factor tuning value may not be needed when an on-chip RF source 192 is included in an RF receiver.

During the tuning phase of operation, the on-chip RF source 192 can operate at a specified RF power level. The RSSI can be measured while the on-chip RF source 192 operates at the specified RF power level. Since an applied RF power level from the on-chip RF source 192 can be known, a target RSSI value can be set for the tuning algorithm. A tuning and control circuit 196 can receive a measured RSSI value from the RSSI memory 122. Based on the measured RSSI and the target RSSI value, the tuning and control circuit 196 can implement any suitable algorithm, such as a 2D SAR and/or a linear search algorithm, to determine the LNA frequency tuning value and/or the LNA quality factor tuning value. This can compensate for process variations, supply voltage variations, temperature variations, the like, or any combination thereof for each individual IC.

The on-chip RF source 192 can be implemented, for example, using a second phase-locked loop (PLL) operating at a desired frequency or at a harmonic of the on-chip crystal oscillator, for example, as described in U.S. Patent Publication No. 2008/0132191 incorporated by reference above. The second PLL can be separate from the PLL 109.

Instead of using an internal RF source or an external RF source, an LC circuit can be tuned by controlling the LC circuit to oscillate such that a signal with a measurable frequency and amplitude is generated. For example, if the LNA 20 is controlled such that it oscillates using one of the quality factor tuning circuits described herein, the LNA 20 can oscillate at a frequency and an amplitude that are controlled by LC circuit parameters. The output of the ADC 116 can be monitored to detect the frequency and/or amplitude of the LC circuit 25 of the LNA 20.

FIG. 13 is a block diagram of an example RF receiver 200 that uses an LNA 20 forced into oscillation. In the example receiver 200, an input to the LNA 20 can be controlled during a frequency and/or quality factor tuning phase of operation to obtain data for use in determining the quality factor tuning value and/or the frequency tuning value during other modes of operation. In the implementation shown in FIG. 13, the RF receiver 200 in which an input to the LNA 20 can be muted by shorting the LNA input to ground during the frequency and/or quality factor tuning phase of operation. A switch 194 can couple an input of the LNA 20 to a ground reference during the frequency and/or quality factor tuning phase of operation. The switch 194 can couple the input of the LNA to the antenna 102 in other modes of operation, such as receiving an RF signal via the antenna 102. The digital demodulator 118 at the output of the ADC 116 can include a frequency discriminator configured to measure an indicator of the frequency of oscillation that is set by the LC circuit 25 of the LNA 20. An indicator of the frequency of oscillation can be provided to a tuning and control circuit 202 by the digital demodulator 118 and/or the RSSI memory 122. The amplitude of the output of the ADC 116 can be measured via the AGC system 120. The indicator of frequency and/or the indicator of amplitude can be provided to a tuning and control circuit 202 that implements any suitable algorithm, such as a 2D SAR and/or a linear search algorithm, to determine the quality factor tuning value and/or the frequency tuning value. These values can tune the LC circuit 25 of the LNA 20, for example, to stabilize the parasitic resistance across the LC circuit 25 and/or to stabilize the gain of the LNA as described herein.

CONCLUSION

In the embodiments described above, some methods, systems, and/or apparatus were described in conjunction with particular embodiments, such as an LNA that includes an LC circuit. A skilled artisan will, however, appreciate that the principles and advantages of the embodiments can be used for any other systems, apparatus, or methods with a need for an LC circuit configured to have a stabilized gain. Some example systems with a need for an LC circuit with a stabilized gain include wired and wireless communications transceivers, clock and data recovery circuits for fiber optic cables, SerDes interfaces, and the like.

Such methods, systems, and/or apparatus can be implemented into various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, wireless devices, a mobile phone (for example, a smart phone), cellular base stations, a telephone, a television, a computer monitor, a computer, a hand-held computer, a tablet computer, a latop computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of certain embodiments is not intended to be exhaustive or to limit the inventions to the precise form disclosed above. While specific embodiments of, and examples for, the inventions are described above for illustrative purposes, various equivalent modifications are possible within the scope of the invention, as those skilled in the relevant art will recognize.

The teachings of the inventions provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods, apparatus, and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined by reference to the appended claims.

What is claimed is:

1. An apparatus comprising:
   an LC circuit having a first end and a second end, the LC circuit having a resonant frequency;
   a positive transconductance circuit operatively coupled to the first end and the second end of the LC circuit, the positive transconductance circuit configured to provide a positive conductance between the first end of the LC circuit and the second end of the LC circuit such that a conductance between the first end of the LC circuit and the second end of the LC circuit is increased; and
   a negative transconductance circuit operatively coupled to the first end and the second end of the LC circuit, the negative transconductance circuit configured to provide a negative conductance between the first end of the LC circuit and the second end of the LC circuit such that the conductance between the first end of the LC circuit and the second end of the LC circuit is decreased.

2. The apparatus of claim 1, wherein an inductor of the LC circuit has resistive losses, and wherein the positive transconductance circuit and the negative transconductance circuit are configured to adjust the conductance between the first end of the LC circuit and the second end of the LC circuit to compensate for the resistive losses.

3. The apparatus of claim 1, wherein the apparatus comprises a low-noise amplifier (LNA), and wherein the LNA includes the LC circuit.

4. The apparatus of claim 3, wherein the positive transconductance circuit and the negative transconductance circuit are configured to stabilize the gain of the LNA by tuning of the quality factor of the LC circuit.

5. The apparatus of claim 4, wherein at least one of the positive transconductance circuit or the negative transconductance circuit is configured to set a voltage gain range for the LNA based at least in part on a variable bias signal at a gate of a transistor of the at least one of the positive transconductance circuit or the negative transconductance circuit.

6. The apparatus of claim 3, wherein:
   the apparatus comprises a receiver;
   the receiver comprises the LNA, the positive transconductance circuit, and the negative transconductance circuit; and
   the positive transconductance circuit is configured to increase the conductance between the first end of the LC circuit and the second end of the LC circuit based on a variation in a performance aspect detected by an open loop of the receiver, the LNA being outside of the open loop.

7. The apparatus of claim 3, wherein:
   the apparatus comprises a receiver;
   the receiver comprises the LNA, the positive transconductance circuit, and the negative transconductance circuit; and
   the positive transconductance circuit is configured to increase the conductance between the first end of the LC circuit and the second end of the LC circuit based on a variation in a performance aspect detected by a closed feedback loop of the receiver that includes the LNA.

8. The apparatus of claim 7, wherein the receiver further comprises an on chip radio frequency (RF) source having an output electrically coupleable to an input of the LNA.

9. The apparatus of claim 7, wherein the receiver further comprises a switch configured to selectively electrically couple an input of the LNA to an off chip radio frequency (RF) source.

10. The apparatus of claim 3, wherein an input of the LNA is controllable during a quality factor tuning phase of operation to obtain data for use in determining a quality factoring tuning value, and wherein the positive transconductance circuit is configured to receive the quality factor tuning value.

11. The apparatus of claim 1, further comprising a temperature detection element configured to obtain an indicator of a temperature associated with the LC circuit, wherein the positive transconductance circuit and the negative transconductance circuit are configured to adjust the conductance between the first end of the LC circuit and the second end of the LC circuit based at least in part on the indicator of IC temperature.

12. The apparatus of claim 1, further comprising an oscillator separate from the LC circuit, wherein the positive transconductance circuit and the negative transconductance circuit are configured to adjust the conductance between the first end of the LC circuit and the second end of the LC circuit based at least in part on an indicator of quality factor generated by the oscillator separate from the LC circuit.

13. The apparatus of claim 1, wherein the LC circuit is embodied in a receiver, wherein the receiver comprises a receiver component configured to determine received signal strength indication (RSSI), and wherein the positive transconductance circuit and the negative transconductance circuit are configured to adjust the conductance between the first end of the LC circuit and the second end of the LC circuit based at least in part on the RSSI.

14. The apparatus of claim 1, wherein the positive transconductance circuit and the negative transconductance circuit are configured to stabilize resistance across the first end of the LC circuit and the second end of the LC circuit.

15. The apparatus of claim 1, wherein the negative transconductance circuit comprises a first field effect transistor and a second field effect transistor, the first field effect transistor having a gate coupled to the first end of the LC circuit and a drain coupled to the second end of the LC circuit, and the second field effect transistor having a gate coupled to the second end of the LC circuit and a drain coupled to the first end of the LC circuit.

16. The apparatus of claim 15, wherein the positive transconductance circuit comprises a third field effect transistor and a fourth field effect transistor, wherein the third field effect transistor is diode connected and has a drain coupled to the second end of the LC circuit, and wherein the fourth field effect transistor is diode connected and has a drain coupled to the first end of the LC circuit.

17. The apparatus of claim 1, wherein the apparatus is configured to either provide the positive conductance between the first end of the LC circuit and the second end of the LC circuit or provide the negative conductance between the first end of the LC circuit and the second end of the LC circuit based on a select signal.

18. An apparatus comprising a low noise amplifier (LNA), the LNA comprising:
an LC circuit having a first node and a second node; and
a quality factor tuning circuit electrically coupled to the first node of the LC circuit and the second node of the LC circuit, the quality factor tuning circuit configured to stabilize a gain of the LNA by selectively coupling either a positive conductance or a negative conductance between the first node of the LC circuit and the second node of the LC circuit.

19. A method of tuning a quality factor of an LC circuit, the method comprising:
generating, using a control block, an indication of a variation of the quality factor of the LC circuit;
using a quality factor tuning circuit operatively coupled to a first end and a second end of the LC circuit and configured to receive an input from the control block, adjusting a conductance applied between the first end of the LC circuit and the second end of the LC circuit by selectively coupling either a positive conductance of the quality factor tuning circuit or a negative conductance of the quality factor tuning circuit between the first end of the LC circuit and the second end of the LC circuit based at least in part on the indication of the variation; and
stabilizing an effective conductance between the first end of the LC circuit and the second end of the LC circuit as operating conditions of the LC circuit change using the control block to control the quality factor tuning circuit.

20. The method of claim 19, wherein adjusting the conductance applied between the first end of the LC circuit and the second end of the LC circuit comprises:
providing the positive conductance between the first end of the LC circuit and the second end of the LC circuit such that the conductance between the first end of the LC circuit and the second end of the LC circuit is increased; and
providing the negative conductance between the first end of the LC circuit and the second end of the LC circuit such that the conductance between the first end of the LC circuit and the second end of the LC circuit is decreased.

21. The method of claim 19, wherein stabilizing comprises stabilizing the quality factor of the LC circuit.

22. The method of claim 19, wherein the variation is caused by at least one of a temperature variation or a process variation.

23. The method of claim 19, wherein the operating conditions include a temperature of an integrated circuit that includes the LC circuit.

24. The method of claim 19, further comprising generating the indication of the variation with a temperature detection element.

25. The method of claim 19, further comprising generating the indication of the variation with an oscillator separate from the LC circuit.

26. The method of claim 25, further comprising detecting an onset of oscillation of the oscillator that is separate from the LC circuit, wherein adjusting is based at least in part on said detecting.

27. The method of claim 19, wherein the LC circuit is embodied in a receiver, wherein the method further comprises measuring a received signal strength indication (RSSI) of a radio frequency (RF) signal received by the receiver, and wherein the indication of the variation is the measured RSSI.

28. The method of claim 27, wherein the LC circuit is embodied in an LNA of a receiver, wherein the method further comprises forcing the LNA into oscillation, wherein said stabilizing is based on RSSI.

29. The method of claim 19, further comprising:
receiving a signal from an off-chip RF source at an input of an LNA that includes the LC circuit; and
determining RSSI based on a specified power level of the signal from the off-chip RF source,
wherein said stabilizing is based on the RSSI.

* * * * *